(12) United States Patent
Ikemoto et al.

(10) Patent No.: US 12,394,876 B2
(45) Date of Patent: Aug. 19, 2025

(54) TRANSMISSION LINE AND ELECTRONIC DEVICE

(71) Applicant: Murata Manufacturing Co., Ltd., Nagaokakyo (JP)

(72) Inventors: Nobuo Ikemoto, Nagaokakyo (JP); Noriaki Okuda, Nagaokakyo (JP); Kosuke Nishio, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 268 days.

(21) Appl. No.: 18/201,211

(22) Filed: May 24, 2023

(65) Prior Publication Data

US 2023/0327309 A1    Oct. 12, 2023

Related U.S. Application Data

(63) Continuation of application No. PCT/JP2021/039061, filed on Oct. 22, 2021.

(30) Foreign Application Priority Data

Nov. 30, 2020   (JP) .................................. 2020-198382

(51) Int. Cl.
*H01P 3/08*     (2006.01)
*H01P 1/02*     (2006.01)

(52) U.S. Cl.
CPC ................ *H01P 3/08* (2013.01); *H01P 3/085* (2013.01); *H01P 1/02* (2013.01)

(58) Field of Classification Search
CPC .. H01P 3/08; H01P 3/085; H01P 3/081; H01P 3/082; H01P 3/088

(Continued)

(56) References Cited

U.S. PATENT DOCUMENTS

2012/0007788 A1   1/2012 Hung
2015/0305142 A1  10/2015 Matsuda
(Continued)

FOREIGN PATENT DOCUMENTS

JP   2002151854 A    5/2002
JP   2014216449 A   11/2014
(Continued)

OTHER PUBLICATIONS

International Search Report in PCT/JP2021/039061, mailed Jan. 11, 2022, 3 pages.

(Continued)

Primary Examiner — Stephen E. Jones
(74) Attorney, Agent, or Firm — Keating & Bennett, LLP

(57) ABSTRACT

A transmission line includes an element body, a signal conductor layer, and a ground conductor layer. The element body includes an insulator layer. The signal conductor layer is below the insulator layer, and the ground conductor layer is above the insulator layer in an element body up-down direction. A hole is located at a surface of the insulator layer and penetrates the insulator layer in the element body up-down direction. At least a portion of the hole overlaps the signal conductor layer when viewed in the element body up-down direction. The hole extends between a left hole-defining surface and a right hole-defining surface. In a cross section orthogonal to the element body front-back direction, the left hole-defining surface includes a left upper end and a left lower end in the element body left-right direction, and the right hole-defining surface includes a right upper end and a right lower end in the element body left-right direction.

19 Claims, 21 Drawing Sheets

(58) Field of Classification Search
USPC .......................................................... 333/238
See application file for complete search history.

(56)  References Cited

U.S. PATENT DOCUMENTS

2017/0271734 A1   9/2017  Yu et al.
2018/0309182 A1  10/2018  Iida et al.

FOREIGN PATENT DOCUMENTS

JP      6489265 B2     3/2019
WO   2017130731 A1    8/2017

OTHER PUBLICATIONS

Written Opinion in PCT/JP2021/039061, mailed Jan. 11, 2022, 3 pages.

Fig.3
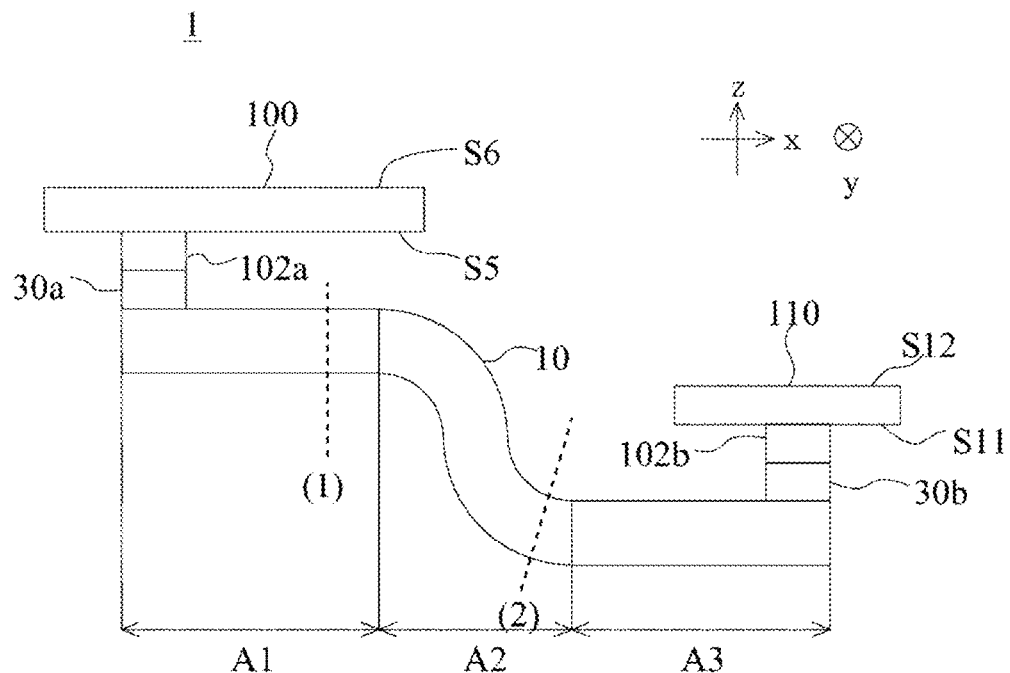
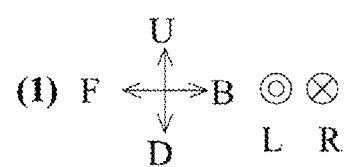
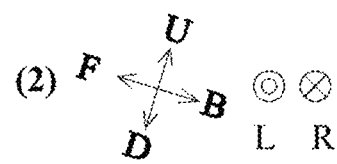

S1:S1L,S1R
S2:S2L,S2R first model

SOLVER: ELECTROMAGNETIC WAVE ANALYSIS
MODE: 0: 1.000000e+03 [Hz](0)
FIELD: ELECTRIC FIELD [V/m]
COMPONENT: MAGNITUDE
PHASE: 0°
SCALE: Linear
OVERALL DIMENSION: 2 mm second model SOLVER: ELECTROMAGNETIC WAVE ANALYSIS
MODE: 0: 1.000000e+03 [Hz](0)
FIELD: ELECTRIC FIELD [V/m]
COMPONENT: MAGNITUDE
PHASE: 0°
SCALE: Linear OVERALL DIMENSION: 2 mm first model second model Fig.16
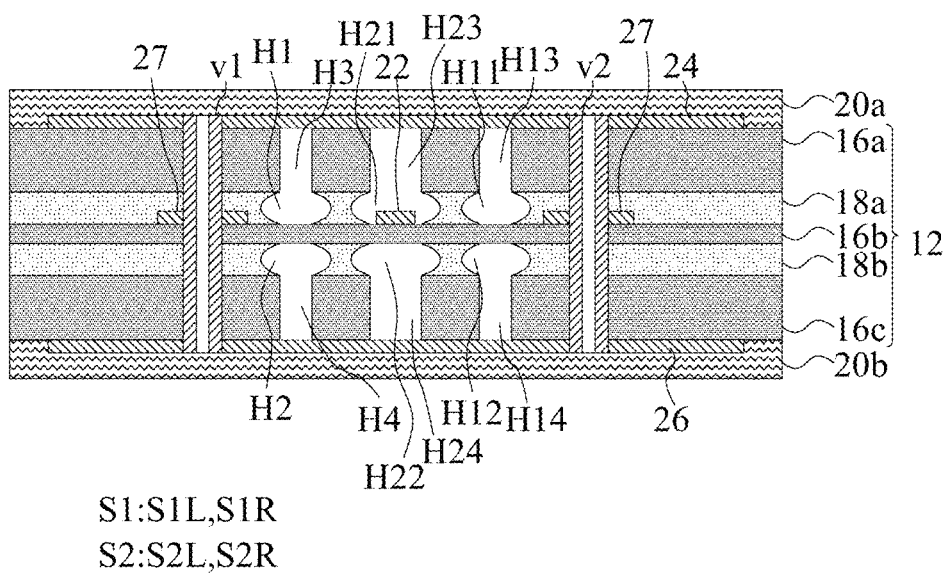
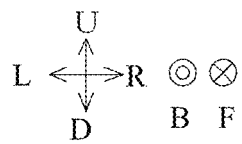

TRANSMISSION LINE AND ELECTRONIC DEVICE

CROSS REFERENCE TO RELATED APPLICATIONS

This application claims the benefit of priority to Japanese Patent Application No. 2020-198382 filed on Nov. 30, 2020 and is a Continuation Application of PCT Application No. PCT/JP2021/039061 filed on Oct. 22, 2021. The entire contents of each application are hereby incorporated herein by reference.

BACKGROUND OF THE INVENTION

1. Field of the Invention

The present invention relates to a transmission line through which a high-frequency signal is transmitted, and an electronic device.

2. Description of the Related Art

As an invention related to a transmission line in the past, for example, a signal transmission line described in Japanese Patent No. 6489265 has been known. The signal transmission line includes a laminated body, a signal conductor, and a ground conductor. The laminated body has a structure in which a plurality of resin layers is laminated. The signal conductor and the ground conductor overlap each other when viewed in a lamination direction of the laminated body. In addition, a hollow portion is provided between the signal conductor and the ground conductor.

In such a signal transmission line, air having a low dielectric constant is present in the hollow portion. The hollow portion is provided near the signal conductor. Therefore, the dielectric constant around the signal conductor is lowered. As a result, in the signal transmission line, the occurrence of a dielectric loss in the high-frequency signal transmitted through the signal conductor is reduced or prevented, so that a transmission loss of the signal transmission line is reduced.

SUMMARY OF THE INVENTION

Incidentally, in the field of the signal transmission line described in Japanese Patent No. 6489265, there is a demand for further reducing the transmission loss of the signal transmission line.

Preferred embodiments of the present invention provide transmission lines and electronic devices each capable of reducing a transmission loss of the transmission line.

A transmission line according to an aspect of a preferred embodiment of the present invention includes an element body including a first insulator layer and a main surface with a normal line extending in an element body up-down direction, a signal conductor layer below the first insulator layer in the element body in the element body up-down direction, and a first ground conductor layer above the first insulator layer in the element body in the element body up-down direction; wherein the first insulator layer includes a first hole penetrating the first insulator layer in the element body up-down direction, a direction in which the signal conductor layer extends is an element body front-back direction, a line width direction of the signal conductor layer is an element body left-right direction, at least a portion of the first hole overlaps the signal conductor layer when viewed in the element body up-down direction, the first hole extends between a first left hole-defining surface and a first right hole-defining surface, and in a cross section orthogonal to the element body front-back direction, the first left hole-defining surface includes a first left upper end and a first left lower end in the element body left-right direction, and the first right hole-defining surface includes a first right upper end and a first right lower end in the element body left-right direction.

The transmission lines and the electronic devices according to preferred embodiments of the present invention achieve reduced transmission loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a left side view of an electronic device 1 including the transmission line 10.

FIG. 4 is a cross-sectional view of a transmission line 10a.

FIG. 16 is a cross-sectional view of a transmission line 10g.

DETAILED DESCRIPTION OF THE PREFERRED EMBODIMENTS

Preferred Embodiments

Structure of Transmission Line

Figure 1:
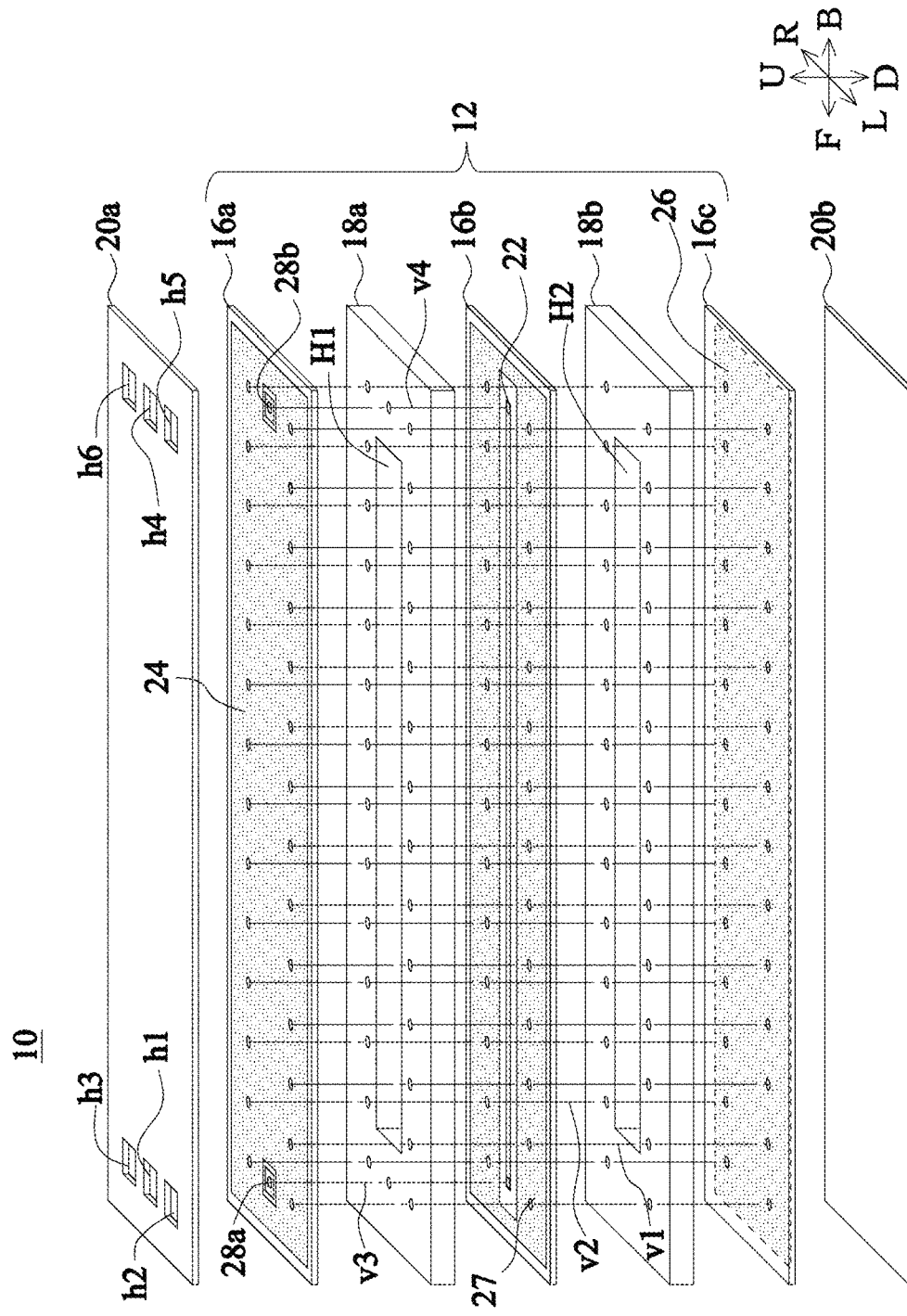
FIG. 1 is an exploded perspective view of a transmission line 10.
Figure 2:
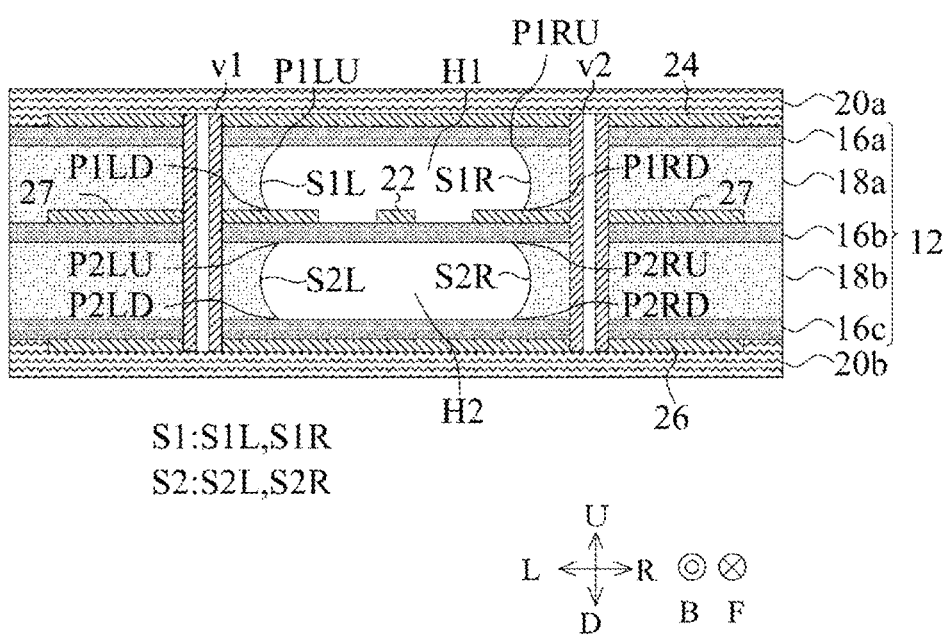
FIG. 2 is a cross-sectional view of the transmission line 10 taken along a line A-A in FIG. 1.

Hereinafter, a structure of a transmission line 10 according to a preferred embodiment of the present invention will be described with reference to the drawings. FIG. 1 is an exploded perspective view of the transmission line 10. Note that in FIG. 1, only representative interlayer connection conductors v1 and v2 among the plurality of interlayer connection conductors v1 and v2 are denoted by reference numerals. FIG. 2 is a cross-sectional view of the transmission line 10 taken along a line A-A of FIG. 1.

In this specification, directions are defined as follows. A direction in which a normal line of a main surface of an element body 12 of the transmission line 10 extends is defined as an element body up-down direction. In addition, a direction in which a signal conductor layer 22 of the transmission line 10 extends is defined as an element body front-back direction. Further, a line width direction of the signal conductor layer 22 is defined as an element body left-right direction. The element body up-down direction, the element body front-back direction, and the element body left-right direction are orthogonal to each other.

Hereinafter, X is a component or member of the transmission line 10. In this specification, unless otherwise specified, each portion of X is defined as follows. The front portion of X means the front half of X. The rear portion of X means the rear half of X. The left portion of X means the left half of X. The right portion of X means the right half of X. The upper portion of X means the upper half of X. The lower portion of X means the lower half of X. The front end of X means an end in the front direction of X. The rear end of X means an end in the rear direction of X. The left end of X means an end in the left direction of X. The right end of X means an end in the right direction of X. The upper end of X means an end in the upward direction of X. The lower end of X means an end in the downward direction of X. The front end portion of X means the front end of X and its vicinity. The rear end portion of X means the rear end of X and its vicinity. The left end portion of X means the left end of X and its vicinity. The right end portion of X means the right end of X and its vicinity. The upper end portion of X means the upper end of X and its vicinity. The lower end portion of X means the lower end of X and its vicinity.

First, the structure of the transmission line 10 will be described with reference to FIG. 1. The transmission line 10 transmits a high-frequency signal. The transmission line 10 is used to electrically connect two circuits in an electronic device such as a smartphone. As illustrated in FIG. 1, the transmission line 10 includes the element body 12, protective layers 20a and 20b, the signal conductor layer 22, a first ground conductor layer 24, a second ground conductor layer 26, a third ground conductor layer 27, signal terminals 28a and 28b, the plurality of interlayer connection conductors v1 and v2, and a plurality of interlayer connection conductors v3 and v4.

The element body 12 has a plate shape. Thus, the element body 12 includes an upper main surface and a lower main surface (main surface). The upper main surface and the lower main surface (main surface) of the element body 12 have a normal line extending in the element body up-down direction. The upper main surface and the lower main surface of the element body 12 each have a rectangular or substantially rectangular shape having long sides extending in the element body front-back direction. Therefore, the length of the element body 12 in the element body front-back direction is longer than the length of the element body 12 in the element body left-right direction.

As illustrated in FIG. 1, the element body 12 includes insulator layers 16a to 16c, 18a, and 18b. The element body 12 has a structure in which the insulator layers 16a, 18a, 16b, 18b, and 16c are laminated in this order from top to bottom in the element body up-down direction. The insulator layers 16a to 16c, 18a, and 18b have the same rectangular or substantially rectangular shape as the element body 12 when viewed in the element body up-down direction. The insulator layers 16a to 16c are dielectric sheets having flexibility. The material of the insulator layers 16a to 16c is, for example, thermoplastic resin. The thermoplastic resin is, for example, a liquid crystal polymer, polytetrafluoroethylene (PTFE), or the like. In addition, the material of the insulator layers 16a to 16c may be polyimide. The insulator layer 18a is an adhesive layer that adheres the insulator layer 16a to the insulator layer 16b. The insulator layer 18a is a single insulator layer. The insulator layer 18a being a single layer means that the insulator layer 18a does not have a structure in which a plurality of insulator layers is bonded to each other. The insulator layer 18b is an adhesive layer that adheres the insulator layer 16b to the insulator layer 16c. The insulator layer 18b is a single insulator layer. The insulator layer 18b (second insulator layer) is provided below the insulator layer 18a (first insulator layer) in the element body up-down direction. In this specification, "the insulator layer 18b is provided below the insulator layer 18a in the element body up-down direction" refers to the following state. The insulator layer 18b is arranged below a plane (upper main surface) that passes through an upper end of the insulator layer 18a and is orthogonal to the element body up-down direction in the element body up-down direction. In this case, the insulator layer 18a and the insulator layer 18b may be arranged, and are not necessary to be arranged in the element body up-down direction. Each of the insulator layers 18a and 18b is an adhesive sheet, a liquid adhesive applied by printing or the like, a viscous bonding sheet adhered in a sheet state, or the like. The material of the insulator layers 18a and 18b is, for example, epoxy resin, fluorine-based resin, acrylic resin, or the like. As described above, the material of the insulator layer 18a (first insulator layer) is different from the material of the insulator layer 16b (third insulator layer) provided below the insulator layer 18a (first insulator layer) in the element body up-down direction.

As illustrated in FIG. 1, the signal conductor layer 22 is provided below the insulator layer 18a (first insulator layer) in the element body 12 in the element body up-down direction. In addition, the signal conductor layer 22 is provided above the insulator layer 18b (second insulator layer) in the element body 12 in the element body up-down direction. In the present preferred embodiment, the signal conductor layer 22 is provided on the upper main surface of the insulator layer 16b. Thus, the signal conductor layer 22 is provided in the element body 12. The signal conductor layer 22 has a linear shape. The signal conductor layer 22 extends in the element body front-back direction. The signal conductor layer 22 is located at the center of the upper main surface of the insulator layer 16b in the element body left-right direction.

The first ground conductor layer 24 is provided above the insulator layer 18a (first insulator layer) in the element body 12 in the element body up-down direction. In the present preferred embodiment, the first ground conductor layer 24 is provided on the upper main surface of the insulator layer 16a. Thus, the first ground conductor layer 24 is located above the signal conductor layer 22 in the element body up-down direction. In this specification, "the first ground conductor layer 24 being located above the signal conductor layer 22 in the element body up-down direction" refers to the following state. At least a portion of the first ground conductor layer 24 is arranged in a region through which the signal conductor layer 22 passes when moving in parallel in an element body upward direction. Therefore, the first ground conductor layer 24 may be located within the region through which the signal conductor layer 22 passes when moving in parallel in the element body upward direction, or may protrude from the region through which the signal conductor layer 22 passes when moving in parallel in the element body upward direction. In the present preferred embodiment, the first ground conductor layer 24 covers the entire or substantially the entire upper main surface of the insulator layer 16a. Therefore, the first ground conductor layer 24 protrudes from the region through which the signal conductor layer 22 passes when moving in parallel in the element body upward direction. In addition, the first ground conductor layer 24 overlaps the signal conductor layer 22 when viewed in the element body up-down direction.

The second ground conductor layer 26 is provided below the insulator layer 18b (second insulator layer) in the element body 12 in the element body up-down direction. In the present preferred embodiment, the second ground conductor layer 26 is provided on the lower main surface of the insulator layer 16c. Thus, the second ground conductor layer 26 is located below the signal conductor layer 22 in the element body up-down direction. In the present preferred embodiment, the second ground conductor layer 26 covers the entire or substantially the entire lower main surface of the insulator layer 16c. Thus, the second ground conductor layer 26 overlaps the signal conductor layer 22 when viewed in the element body up-down direction. As a result, the signal conductor layer 22, the first ground conductor layer 24, and the second ground conductor layer 26 have a strip line structure.

The third ground conductor layer 27 is provided below the insulator layer 18a (first insulator layer) in the element body 12 in the element body up-down direction. In the present preferred embodiment, the third ground conductor layer 27 is provided on the upper main surface of the insulator layer 16b. The third ground conductor layer 27 surrounds the signal conductor layer 22 when viewed in an up-down direction. Therefore, the third ground conductor layer 27 is provided on the left and right of the signal conductor layer 22 in the element body left-right direction.

The plurality of interlayer connection conductors v1 and v2 electrically connects the first ground conductor layer 24, the second ground conductor layer 26, and the third ground conductor layer 27. More specifically, the plurality of interlayer connection conductors v1 and v2 passes through the insulator layers 16a to 16c, 18a, and 18b in the element body up-down direction. Upper ends of the plurality of interlayer connection conductors v1 and v2 are connected to the first ground conductor layer 24. Lower ends of the plurality of interlayer connection conductors v1 and v2 are connected to the second ground conductor layer 26. Intermediate portions of the plurality of interlayer connection conductors v1 and v2 are connected to the third ground conductor layer 27. The plurality of interlayer connection conductors v1 is provided on the left of the signal conductor layer 22 in the element body left-right direction. The plurality of interlayer connection conductors v1 is arranged in a row at equal or substantially equal intervals in the element body front-back direction. The plurality of interlayer connection conductors v2 is provided on the right of the signal conductor layer 22 in the element body left-right direction. The plurality of interlayer connection conductors v2 is arranged in a row at equal or substantially equal intervals in the element body front-back direction.

The signal terminal 28a is provided on the upper main surface of the element body 12. More specifically, the signal terminal 28a is provided at the front end portion of the upper main surface of the insulator layer 16a. The signal terminal 28a overlaps the left end portion of the signal conductor layer 22 when viewed in the element body up-down direction. However, the signal terminal 28a does not overlap a first hole H1 and a second hole H2 described later when viewed in the element body up-down direction. The signal terminal 28a each have a rectangular or substantially rectangular shape when viewed in the element body up-down direction. The first ground conductor layer 24 is not provided around the signal terminal 28a so that the signal terminal 28a is insulated from the first ground conductor layer 24.

The interlayer connection conductor v3 electrically connects the signal terminal 28a to the signal conductor layer 22. To be specific, the interlayer connection conductor v3 passes through the insulator layers 16a and 18a in the element body up-down direction. The upper end of the interlayer connection conductor v3 is connected to the signal terminal 28a. The lower end of the interlayer connection conductor v3 is connected to the front end portion of the signal conductor layer 22. Thus, the signal terminal 28a is electrically connected to the signal conductor layer 22. A high-frequency signal is input to and output from the signal conductor layer 22 through the signal terminal 28a.

Note that the signal terminal 28b and the interlayer connection conductor v4 have structures that are bilaterally symmetrical to the signal terminal 28a and the interlayer connection conductor v3. Therefore, description of the signal terminal 28b and the interlayer connection conductor v4 will be omitted.

The signal conductor layer 22, the first ground conductor layer 24, the second ground conductor layer 26, the third ground conductor layer 27, and the signal terminals 28a and 28b described above are formed by, for example, applying etching to metal foil provided on the upper main surfaces or the lower main surfaces of the insulator layers 16a to 16c. The metal foil is, for example, copper foil. In addition, the interlayer connection conductors v1 to v4 are, for example, through-hole conductors. The through-hole conductors are produced by forming through-holes in the insulator layers 16a to 16c, 18a, and 18b and plating the through-holes.

The protective layers 20a and 20b are flexible insulator layers. However, the protective layers 20a and 20b are not part of the element body 12. The protective layers 20a and 20b have the same rectangular or substantially rectangular shape as the element body 12 when viewed in the element body up-down direction.

The protective layer 20a covers the entire or substantially the entire upper main surface of the insulator layer 16a. Thus, the protective layer 20a protects the first ground conductor layer 24. However, openings h1 to h6 are provided in the protective layer 20a. The opening h1 overlaps the signal terminal 28a when viewed in the element body up-down direction. Thus, the signal terminal 28*a* is exposed to the outside from the transmission line 10 through the opening h1. The opening h2 is provided on the left of the opening h1 in the element body left-right direction. The opening h3 is provided on the right of the opening h1 in the element body left-right direction. Thus, the first ground conductor layer 24 is exposed to the outside from the transmission line 10 through the openings h2 and h3. Note that the structures of the openings h4 to h6 are bilaterally symmetrical to the structures of the openings h1 to h3. Therefore, description of the openings h4 to h6 will be omitted.

Next, the first hole H1 and the second hole H2 will be described with reference to FIG. 1 and FIG. 2. The insulator layer 18*a* is provided with the first hole H1 penetrating through the insulator layer 18*a* in the element body up-down direction. More specifically, as illustrated in FIG. 1, when viewed in the element body up-down direction, the first hole H1 has a rectangular or substantially rectangular shape having long sides extending in the element body front-back direction. The first hole H1 is provided at the center of the insulator layer 18*a* in the element body left-right direction. Thus, at least a portion of the first hole H1 overlaps the signal conductor layer 22 when viewed in the element body up-down direction. As illustrated in FIG. 2, the signal conductor layer 22 is located in the first hole H1. However, the front end and the rear end of the signal conductor layer 22 do not overlap the first hole H1 when viewed in the element body up-down direction. That is, the front end and the rear end of the signal conductor layer 22 are not located in the first hole H1.

In addition, as illustrated in FIG. 2, the right end portion of the left portion of the third ground conductor layer 27 is located in the first hole H1. The left end portion of the right portion of the third ground conductor layer 27 is located in the first hole H1.

Here, as illustrated in FIG. 2, a surface on which the insulator layer 18*a* includes the first hole H1 is defined as a first hole forming surface S1. In addition, the first hole forming surface S1 includes a left portion S1L and a right portion S1R. Further, the left portion S1L of the first hole forming surface S1 has an upper end P1LU and a lower end P1LD. The right portion S1R of the first hole forming surface S1 includes an upper end P1RU and a lower end P1RD.

The left portion S1L of the first hole forming surface S1 has an arc shape protruding in an element body left direction when viewed in the element body front-back direction. That is, the left portion S1L of the first hole forming surface S1 is curved so as to protrude in the element body left direction from the upper end P1LU of the left portion S1L of the first hole forming surface S1 and the lower end P1LD of the left portion S1L of the first hole forming surface S1 in a cross section orthogonal to the element body front-back direction. Thus, the center of the left portion S1L of the first hole forming surface S1 in the element body up-down direction is at the leftmost position in the left portion S1L. As described above, as illustrated in FIG. 2, in the cross section orthogonal to the element body front-back direction, the left portion S1L of the first hole forming surface S1 includes a portion located on the left of the upper end P1LU of the left portion S1L of the first hole forming surface S1 and the lower end P1LD of the left portion S1L of the first hole forming surface S1 in the element body left-right direction.

The right portion S1R of the first hole forming surface S1 has an arc shape protruding in an element body right direction when viewed in the element body front-back direction. That is, the right portion S1R of the first hole forming surface S1 is curved so as to protrude in the element body right direction from the upper end P1RU of the right portion S1R of the first hole forming surface S1 and the lower end P1RD of the right portion S1R of the first hole forming surface S1 in the cross section orthogonal to the element body front-back direction. Thus, the center of the right portion S1R of the first hole forming surface S1 in the element body up-down direction is on the rightmost position in the right portion S1R. As described above, as illustrated in FIG. 2, in the cross section orthogonal to the element body front-back direction, the right portion S1R of the first hole forming surface S1 includes a portion located on the right of the upper end P1RU of the right portion S1R of the first hole forming surface S1 and the lower end P1RD of the right portion S1R of the first hole forming surface S1 in the element body left-right direction.

The insulator layer 18*b* is provided with the second hole H2 penetrating through the insulator layer 18*b* in the element body up-down direction. More specifically, as illustrated in FIG. 1, when viewed in the element body up-down direction, the second hole H2 has a rectangular or substantially rectangular shape having long sides extending in the element body front-back direction. The second hole H2 is provided at the center of the insulator layer 18*b* in the element body left-right direction. Thus, at least a portion of the second hole H2 overlaps the signal conductor layer 22 when viewed in the element body up-down direction. However, the front end and the rear end of the signal conductor layer 22 do not overlap the second hole H2 when viewed in the element body up-down direction.

Here, a surface on which the insulator layer 18*b* includes the second hole H2 is defined as a second hole forming surface S2. In addition, the second hole forming surface S2 includes a left portion S2L and a right portion S2R. Further, the left portion S2L of the second hole forming surface S2 includes an upper end P2LU and a lower end P2LD. The right portion S2R of the second hole forming surface S2 includes an upper end P2RU and a lower end P2RD.

The left portion S2L of the second hole forming surface S2 has an arc shape protruding in the element body left direction when viewed in the element body front-back direction. That is, the left portion S2L of the second hole forming surface S2 is curved so as to protrude in the element body left direction from the upper end P2LU of the left portion S2L of the second hole forming surface S2 and the lower end P2LD of the left portion S2L of the second hole forming surface S2 in the cross section orthogonal to the element body front-back direction. Thus, the center of the left portion S2L of the second hole forming surface S2 in the element body up-down direction is on the leftmost position in the left portion S2L. As described above, as illustrated in FIG. 2, in the cross section orthogonal to the element body front-back direction, the left portion S2L of the second hole forming surface S2 includes a portion located on the left of the upper end P2LU of the left portion S2L of the second hole forming surface S2 and the lower end P2LD of the left portion S2L of the second hole forming surface S2 in the element body left-right direction.

The right portion S2R of the second hole forming surface S2 has an arc shape protruding in the element body right direction when viewed in the element body front-back direction. That is, the right portion S2R of the second hole forming surface S2 is curved so as to protrude in the element body right direction from the upper end P2RU of the right portion S2R of the second hole forming surface S2 and the lower end P2RD of the right portion S2R of the second hole forming surface S2 in the cross section orthogonal to the element body front-back direction. Thus, the center in the element body up-down direction of the right portion S2R of the second hole forming surface S2 is on the rightmost position in the right portion S2R. As described above, as illustrated in FIG. 2, in the cross section orthogonal to the element body front-back direction, the right portion S1R of the second hole forming surface S2 includes a portion located on the right of the upper end P2RU of the right portion S2R of the second hole forming surface S2 and the lower end P2RD of the right portion S2R of the second hole forming surface S2 in the element body left-right direction.

A non-limiting example of a method of forming the first hole H1 and the second hole H2 as described above will be described. As a method of forming the first hole H1 and the second hole H2, there are a thermal expansion method, a volatilization method, and a pressure method.

In the thermal expansion method, a difference between a coefficient of linear expansion of the insulator layers 16a to 16c and a coefficient of linear expansion of the insulator layers 18a and 18b is used. When the insulator layers 16a to 16c, 18a, and 18b are subjected to thermal pressure-bonding, the first hole H1 is reduced in size due to the pressure of thermal pressure-bonding. Here, the coefficient of linear expansion of the insulator layers 18a and 18b are larger than the coefficient of linear expansion of the insulator layers 16a to 16c. For this reason, when the thermal pressure-bonding of the insulator layers 16a to 16c, 18a, and 18b is completed and the insulator layers 16a to 16c, 18a, and 18b are cooled, the insulator layers 18a and 18b are contracted more than the insulator layers 16a to 16c. However, the upper main surface of the insulator layer 18a is bonded to the lower main surface of the insulator layer 16a. The lower main surface of the insulator layer 18a is bonded to the upper main surface of the insulator layer 16b. Therefore, the upper main surface and the lower main surface of the insulator layer 18a are respectively constrained by the lower main surface of the insulator layer 16a and the upper main surface of the insulator layer 16b. Therefore, the left portion S1L of the first hole forming surface S1 is deformed so as to protrude in the element body left direction. Similarly, the right portion S1R of the first hole forming surface S1 is deformed so as to protrude in the element body right direction. Similarly, the left portion S2L of the second hole forming surface S2 is deformed so as to protrude in the element body left direction. Similarly, the right portion S2R of the second hole forming surface S2 is deformed so as to protrude in the element body right direction. Thus, the first hole H1 and the second hole H2 are formed.

In the volatilization method, volatilization of components contained in the insulator layers 18a and 18b by thermal pressure-bonding of the insulator layers 16a to 16c, 18a, and 18b is used. More specifically, when the insulator layers 16a to 16c, 18a, and 18b are subjected to thermal pressure-bonding, the first hole H1 and the second hole H2 are reduced in size due to the pressure of thermal pressure-bonding. Here, components contained in the insulator layers 18a and 18b are volatilized by the thermal pressure-bonding of the insulator layers 16a to 16c, 18a, and 18b. Therefore, the rate of decrease in the volumes of the insulator layers 18a and 18b before and after thermal pressure-bonding is greater than the rate of decrease in the volumes of the insulator layers 16a to 16c before and after thermal pressure-bonding. However, the upper main surface of the insulator layer 18a is bonded to the lower main surface of the insulator layer 16a. The lower main surface of the insulator layer 18a is bonded to the upper main surface of the insulator layer 16b. Therefore, the upper main surface and the lower main surface of the insulator layer 18a are respectively constrained by the lower main surface of the insulator layer 16a and the upper main surface of the insulator layer 16b. Therefore, the left portion S1L of the first hole forming surface S1 is deformed so as to protrude in the element body left direction. Similarly, the right portion S1R of the first hole forming surface S1 is deformed so as to protrude in the element body right direction. Similarly, the left portion S2L of the second hole forming surface S2 is deformed so as to protrude in the element body left direction. Similarly, the right portion S2R of the second hole forming surface S2 is deformed so as to protrude in the element body right direction. Thus, the first hole H1 and the second hole H2 are formed.

In the pressure method, expansion of the first hole H1 and the second hole H2 after thermal pressure-bonding of the insulator layers 16a to 16c, 18a, and 18b is used. More specifically, when the insulator layers 16a to 16c, 18a, and 18b are subjected to thermal pressure-bonding, the first hole H1 and the second hole H2 are reduced in size due to the pressure of thermal pressure-bonding. When the thermal pressure-bonding of the insulator layers 16a to 16c, 18a, and 18b is completed, the pressures applied to the first hole H1 and the second hole H2 become small, and thus the first hole H1 and the second hole H2 become large. However, the upper main surface of the insulator layer 18a is bonded to the lower main surface of the insulator layer 16a. The lower main surface of the insulator layer 18a is bonded to the upper main surface of the insulator layer 16b. Therefore, the upper main surface and the lower main surface of the insulator layer 18a are respectively constrained by the lower main surface of the insulator layer 16a and the upper main surface of the insulator layer 16b. Therefore, the left portion S1L of the first hole forming surface S1 is deformed so as to protrude in the element body left direction. Similarly, the right portion S1R of the first hole forming surface S1 is deformed so as to protrude in the element body right direction. Similarly, the left portion S2L of the second hole forming surface S2 is deformed so as to protrude in the element body left direction. Similarly, the right portion S2R of the second hole forming surface S2 is deformed so as to protrude in the element body right direction. Thus, the first hole H1 and the second hole H2 are formed.

Structure of Electronic Device

Next, a structure of an electronic device 1 including the transmission line 10 will be described with reference to the drawings. FIG. 3 is a left side view of the electronic device 1 including the transmission line 10. The electronic device 1 is, for example, a portable wireless communication terminal. The electronic device 1 is, for example, a smartphone.

The transmission line 10 is bent as illustrated in FIG. 3. "The transmission line 10 is bent" means that the transmission line 10 is deformed and bent by an external force being applied to the transmission line 10. Hereinafter, a section in which the transmission line 10 is bent is referred to as a bending section A2. Sections in which the transmission line 10 is not bent are referred to as non-bending sections A1 and A3. An x-axis, a y-axis, and a z-axis in the electronic device 1 are defined as follows. The x-axis is the element body front-back direction in the non-bending section A1. The y-axis is the element body left-right direction in the non-bending section A1. The z-axis is the element body up-down direction in the non-bending section A1. The non-bending section A1, the bending section A2, and the non-bending section A3 are arranged in this order in the positive direction of the x-axis.

As illustrated in FIG. 3, the bending section A2 is bent in a z-axis direction. Therefore, as illustrated in FIG. 3, the element body up-down direction and the element body front-back direction differ depending on the position of the transmission line 10. In the non-bending section A1 and the non-bending section A3 (for example, a position (1)) in which the element body 12 is not bent, the element body up-down direction and the element body front-back direction coincide with the z-axis direction and an x-axis direction, respectively. On the other hand, in the bending section A2 (for example, a position (2)) in which the element body 12 is bent, the element body up-down direction and the element body front-back direction do not coincide with the z-axis direction and the x-axis direction, respectively.

As illustrated in FIG. 3, the electronic device 1 includes the transmission line 10, connectors 30a, 30b, 102a, and 102b, and circuit substrates 100 and 110.

The circuit substrates 100 and 110 have a plate shape. The circuit substrate 100 includes main surfaces S5 and S6. The main surface S5 is located on the negative direction side of the z-axis relative to the main surface S6. The circuit substrate 110 includes main surfaces S11 and S12. Main surface S11 is located on the negative direction side of the z-axis relative to the main surface S12. The circuit substrates 100 and 110 includes a wiring conductor layer, a ground conductor layer, an electrode, and the like (not illustrated).

The connectors 30a and 30b are mounted on main surfaces (upper main surfaces) of the non-bending section A1 and the non-bending section A3 on the positive direction side of the z-axis, respectively. More specifically, the connector 30a is mounted on the signal terminal 28a and the first ground conductor layer 24 exposed from the openings h1 to h3. The connector 30b is mounted on the signal terminal 28b and the first ground conductor layer 24 exposed from the openings h4 to h6.

The connectors 102a and 102b are mounted on the main surface S5 of the circuit substrate 100 and the main surface S11 of the circuit substrate 110, respectively. The connectors 102a and 102b are connected to the connectors 30a and 30b, respectively. Thus, the transmission line 10 electrically connects the circuit substrate 100 and the circuit substrate 110.

Effects

According to the transmission line 10, it is possible to reduce the transmission loss of the transmission line 10. More specifically, the insulator layer 18a is provided with the first hole H1 penetrating through the insulator layer 18a in the element body up-down direction. Air having a low dielectric constant is present in the first hole H1. At least a portion of the first hole H1 overlaps the signal conductor layer 22 when viewed in the element body up-down direction. Therefore, the dielectric constant around the signal conductor layer 22 is reduced. As a result, in the transmission line 10, the occurrence of dielectric loss in the high-frequency signal transmitted through the signal conductor layer 22 is reduced or prevented, and thus the transmission loss of the transmission line 10 is reduced. The second hole H2 also contributes to a reduction in the transmission loss of the transmission line 10 for the same reason as the first hole H1.

Further, according to the transmission line 10, it is possible to reduce the transmission loss of the transmission line 10 while reducing or preventing separation between the insulator layer 16a and the insulator layer 18a and separation between the insulator layer 16b and the insulator layer 18a. More specifically, as illustrated in FIG. 2, in the cross section orthogonal to the element body front-back direction, the left portion S1L of the first hole forming surface S1 includes a portion located on the left of the upper end P1LU of the left portion S1L of the first hole forming surface S1 and the lower end P1LD of the left portion S1L of the first hole forming surface S1 in the element body left-right direction. Accordingly, the upper end P1LU of the left portion S1L of the first hole forming surface S1 is away from the left surface of the element body 12. That is, a region where the insulator layer 16a and the insulator layer 18a are bonded to each other is widened. Similarly, the lower end P1LD of the left portion S1L of the first hole forming surface S1 is away from the left surface of the element body 12. That is, a region where the insulator layer 16b and the insulator layer 18a are bonded to each other is widened. As a result, the separation between the insulator layer 16a and the insulator layer 18a and the separation between the insulator layer 16b and the insulator layer 18a are reduced or prevented.

Further, as illustrated in FIG. 2, in the cross section orthogonal to the element body front-back direction, the left portion S1L of the first hole forming surface S1 includes a portion located on the left of the upper end P1LU of the left portion S1L of the first hole forming surface S1 and the lower end P1LD of the left portion S1L of the first hole forming surface S1 in the element body left-right direction. As a result, the left portion S1L of the first hole forming surface S1 has a shape protruding in the element body left direction in the cross section orthogonal to the element body front-back direction. Therefore, the volume of the first hole H1 is large. As a result, in the transmission line 10, the occurrence of dielectric loss in the high-frequency signal transmitted through the signal conductor layer 22 is reduced or prevented, and thus the transmission loss of the transmission line 10 is reduced. For the same reason as the first hole H1, the second hole H2 also contributes to reduction or prevention of separation between the insulator layer 16b and the insulator layer 18b, reduction or prevention of separation between the insulator layer 16c and the insulator layer 18b, and reduction or prevention of the transmission loss of the transmission line 10.

Note that the right portion S1R of the first hole forming surface S1 has a shape that is bilaterally symmetrical to the left portion S1L of the first hole forming surface S1. Thus, according to the transmission line 10, it is possible to reduce the transmission loss of the transmission line 10 while reducing or preventing the separation between the insulator layer 16a and the insulator layer 18a and the separation between the insulator layer 16b and the insulator layer 18a.

In addition, the left portion S1L of the first hole forming surface S1 has a shape protruding in the element body left direction in the cross section orthogonal to the element body front-back direction. The left portion S1L of the first hole forming surface S1 is curved. As a result, when force is applied to the transmission line 10, concentration of stress on a portion of the left portion S1L is reduced or prevented. That is, the transmission line 10 is less likely to be damaged.

In addition, according to the transmission line 10, since the first hole H1 is provided, the element body 12 is easily deformed. As a result, it becomes easy to bend the transmission line 10 to be used. Further, the amount of an adhesive used in the transmission line 10 is reduced. Therefore, the manufacturing cost of the transmission line 10 can be reduced and the reduction in weight of the transmission line 10 can be achieved. Note that like the first hole H1, the second hole H2 also contributes to easily deforming the element body 12 and reducing the amount of the adhesive.

Further, according to the transmission line 10, the transmission loss of the transmission line 10 can be reduced for the following reason. More specifically, an electric field is radiated from the signal conductor layer 22. The electric field is more likely to pass through the insulator layer 16a having a higher dielectric constant than the first hole H1 having a lower dielectric constant. Therefore, when the insulator layer 16a is present near the signal conductor layer 22, the electric field radiated by the signal conductor layer 22 extends in the element body left direction and passes through the insulator layer 16a. In this case, on the left surface of the signal conductor layer 22, the electric field is concentrated at the corner of the signal conductor layer 22. Such concentration of the electric field causes concentration of current at the corner of the signal conductor layer 22. As a result, the transmission loss of the transmission line 10 may increase.

Therefore, as illustrated in FIG. 2, in the cross section orthogonal to the element body front-back direction, the left portion S1L of the first hole forming surface S1 includes a portion located on the left of the upper end P1LU of the left portion S1L of the first hole forming surface S1 and the lower end P1LD of the left portion S1L of the first hole forming surface S1 in the element body left-right direction. Therefore, the left portion S1L of the first hole forming surface S1 protrudes in a direction away from the signal conductor layer 22. Thus, the insulator layer 18a located near the signal conductor layer 22 is reduced. Therefore, the electric field radiated by the signal conductor layer 22 spreads in an upper left direction of the element body. In this case, on the left surface of the signal conductor layer 22, concentration of the electric field at the corner of the signal conductor layer 22 is reduced or prevented. As a result, according to the transmission line 10, the transmission loss of the transmission line 10 can be reduced or prevented.

In the transmission line 10, since the first hole H1 is located near the interlayer connection conductors v1 and v2, capacitance is less likely to be generated between the signal conductor layer 22 and the interlayer connection conductors v1 and v2. This makes it possible to bring the signal conductor layer 22 close to the interlayer connection conductors v1 and v2. Note that "the first hole H1 is located near the interlayer connection conductor v1" means, for example, that the distance between the left end of the first hole H1 and the interlayer connection conductor v1 located on the left of the first hole H1 in the element body left-right direction is shorter than the distance between the interlayer connection conductor v1 and the signal conductor layer 22.

In the transmission line 10, since the first hole H1 is located near the interlayer connection conductors v1 and v2, the wavelengths of the high-frequency signals transmitted through the plurality of interlayer connection conductors v1 and v2 become longer. As a result, an interval between the plurality of interlayer connection conductors v1 and an interval between the plurality of interlayer connection conductors v2 are increased.

Water vapor or the like in the air may oxidize a conductor layer such as the signal line conductor layer 20 and degrade signal characteristics. In the transmission line 10, since a contact area between the air in the first hole H1 and resin 18a is increased, performance of suction of the unnecessary gas contained in the air in the resin 18a is increased, and the water vapor or the like contained in the air is reduced. As described above, according to the transmission line 10, it is possible to reduce or prevent deterioration of characteristics by reducing water vapor or the like in the air.

In the transmission line 10, the separation between the insulator layer 16b and the insulator layer 18a is reduced or prevented. More specifically, when the right end portion of the left portion of the third ground conductor layer 27 is not located in the first hole H1, the right end portion of the left portion of the third ground conductor layer 27 is located on the left of the left portion S1L of the first hole forming surface S1. In this case, a gap is formed between the insulator layer 16b and the insulator layer 18a in the vicinity of the lower end P1LD of the left portion S1L of the first hole forming surface S1. Such a gap may cause the separation between the insulator layer 16b and the insulator layer 18a. Thus, the right end portion of the left portion of the third ground conductor layer 27 is located in the first hole H1. That is, a portion of the third ground conductor layer 27 is located in the first hole H1. As a result, no gap is formed between the insulator layer 16b and the insulator layer 18a in the vicinity of the lower end P1LD of the left portion S1L of the first hole forming surface S1. As a result, in the transmission line 10, the insulator layer 16b and the insulator layer 18a are reduced or prevented from being separated from each other.

In addition, in the transmission line 10, as illustrated in FIG. 2, the signal conductor layer 22 is located in the first hole H1. As a result, the signal conductor layer 22 comes into contact with air, so that the dielectric constant around the signal conductor layer 22 is lowered. As a result, the occurrence of dielectric loss in a high-frequency signal transmitted through the signal conductor layer 22 is reduced or prevented.

In addition, in the transmission line 10, the signal terminal 28a does not overlap the first hole H1 and the second hole H2 described later when viewed in the element body up-down direction. As a result, the transmission line 10 is reduced or prevented from being damaged due to stress during thermal pressure-bonding when the transmission line 10 is manufactured.

First Modification

Figure 4:
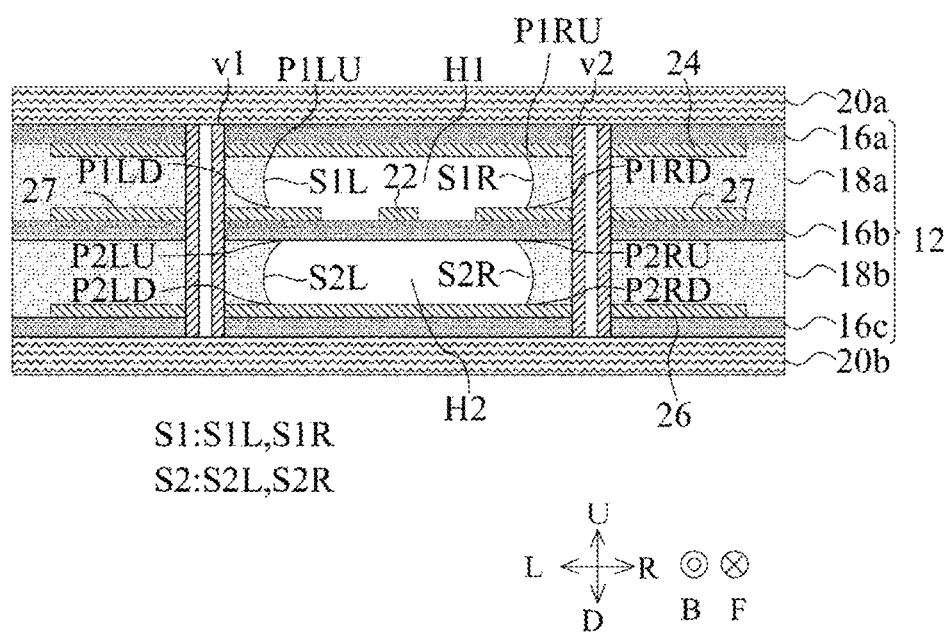

Hereinafter, a transmission line 10a according to a first modification of a preferred embodiment of the present invention will be described with reference to the drawings. FIG. 4 is a cross-sectional view of the transmission line 10a.

The transmission line 10a is different from the transmission line 10 in the positions where the first ground conductor layer 24 and the second ground conductor layer 26 are provided. More specifically, the first ground conductor layer 24 is provided on the lower main surface of the insulator layer 16a. Thus, the first ground conductor layer 24 faces the first hole H1. The second ground conductor layer 26 is provided on the upper main surface of the insulator layer 16c. Thus, the second ground conductor layer 26 faces the second hole H2. Since the other structure of the transmission line 10a is the same as that of the transmission line 10, the description thereof will be omitted. In addition, the transmission line 10a can achieve the same effect as the transmission line 10.

Second Modification

Figure 5:
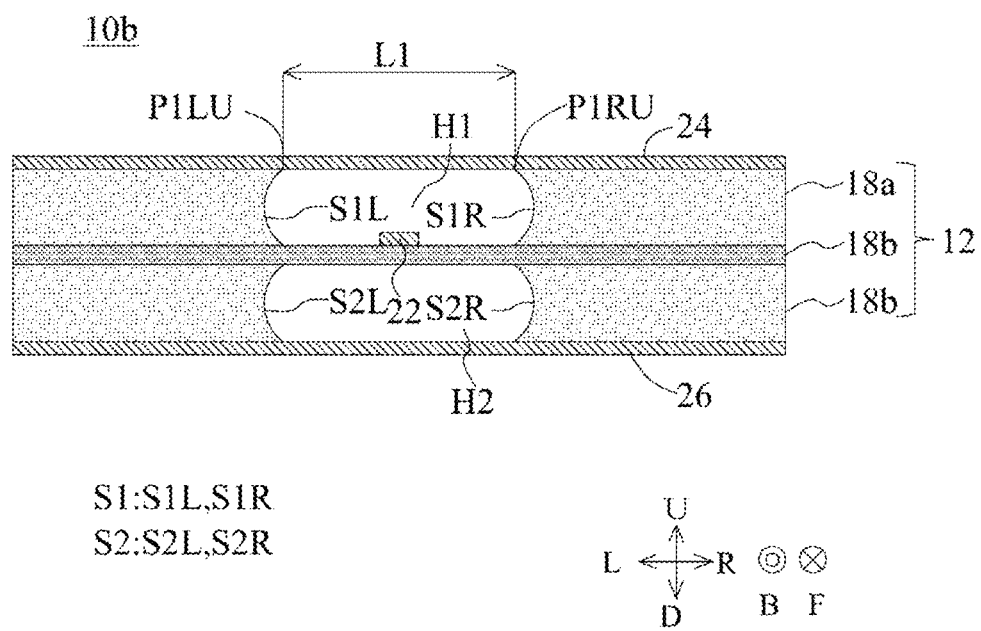
FIG. 5 is a cross-sectional view of a transmission line 10b.

Hereinafter, a transmission line 10b according to a second modification of a preferred embodiment of the present invention will be described with reference to the drawings. FIG. 5 is a cross-sectional view of the transmission line 10b.

Figure 6:
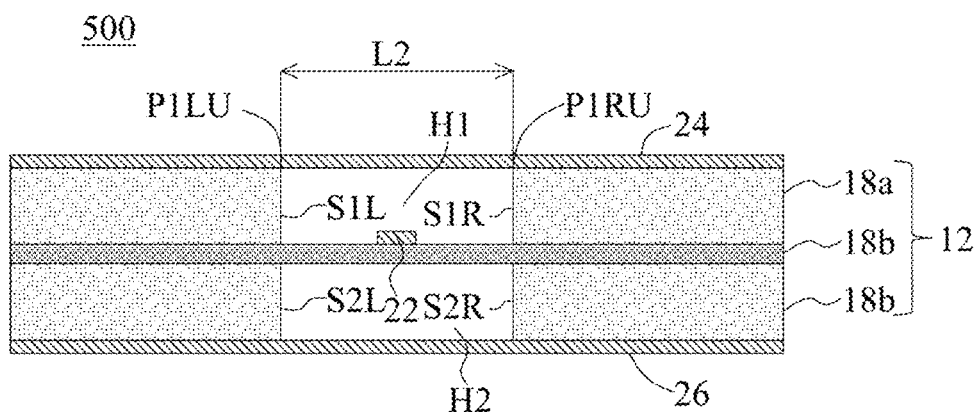
FIG. 6 is a cross-sectional view of a transmission line 500 according to a comparative example.

FIG. 6 is a cross-sectional view of a transmission line 500 according to a comparative example.

The transmission line 10b is different from the transmission line 10 in that the transmission line 10b does not include the insulator layers 16a and 16c, the protective layers 20a and 20b, and the interlayer connection conductors v1 and v2. As described above, the insulator layers 16a and 16c, the protective layers 20a and 20b, and the interlayer connection conductors v1 and v2 are not essential configurations. Note that in the transmission line 10b, the first ground conductor layer 24 is attached to the upper main surface of the insulator layer 18a by, for example, a transfer method. The second ground conductor layer 26 is attached to the lower main surface of the insulator layer 18b by, for example, a transfer method. Since the other structure of the transmission line 10b is the same as that of the transmission line 10, the description thereof will be omitted. In addition, the transmission line 10b can achieve the same effect as the transmission line 10.

The inventor of the present application performed a computer simulation described below in order to further clarify the effects of the transmission line 10b. To be specific, a first model having the structure of the transmission line 10b and a second model having the structure of the transmission line 500 were created. A different point between the first model and the second model is each of the shapes of the first hole H1 and the second hole H2. Note that a distance L1 between the upper end P1LU and the upper end P1RU in the first model is equal to a distance L2 between the upper end P1LU and the upper end P1RU in the second model. The inventor of the present application used a computer to calculate the distribution of the electric field around the signal conductor layer 22 using the first model and the second model. In addition, the inventor of the present application used a computer to calculate the relationship between the frequencies of the first model and the second model and the transmission losses of the first model and the second model. At this time, the inventor of the present application performed the calculation under a condition in which a high-frequency signal is applied between the first ground conductor layer 24 and the second ground conductor layer 26 while being electrically connected to each other, and the signal conductor layer 22.

Figure 7:
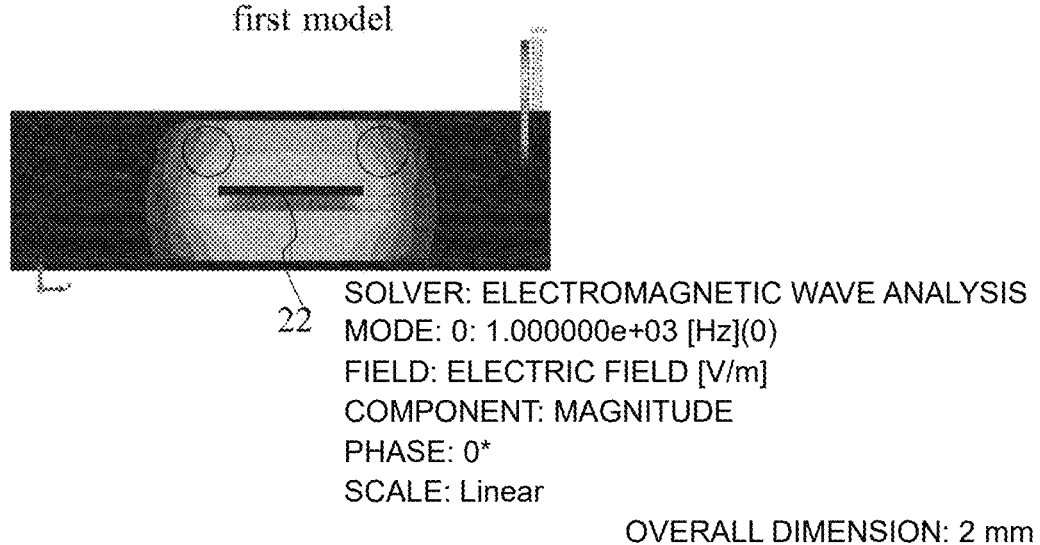
FIG. 7 is a diagram illustrating an electric field distribution of a first model.
Figure 8:
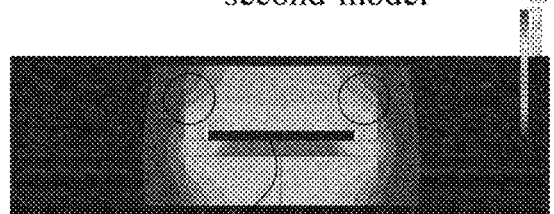
FIG. 8 is a diagram illustrating an electric field distribution of a second model.

FIG. 7 is a diagram illustrating an electric field distribution of the first model. FIG. 8 is a diagram illustrating an electric field distribution of the second model. In FIG. 7 and FIG. 8, a dark portion is a portion where the intensity of the electric field is high, and a light portion is a portion where the intensity of the electric field is low. When FIG. 7 and FIG. 8 are compared with each other, it can be seen that the region where the intensity of the electric field is low in the first model is wider than the region where the intensity of the electric field is low in the second model. In addition, it can be seen that the intensity of the electric field of the insulator layer having a larger dielectric loss than air is smaller in the first model than in the second model. It is considered that this is because the volumes of the first hole H1 and the second hole H2 of the first model are larger than the volumes of the first hole H1 and the second hole H2 of the second model. As described above, when the region where the intensity of the electric field is low in the first model becomes wider than the region where the intensity of the electric field is low in the second model and the intensity of the electric field of the insulator layer becomes low, the transmission loss of the high-frequency signal generated in the first model becomes smaller than the transmission loss of the high-frequency signal generated in the second model.

Figure 9:
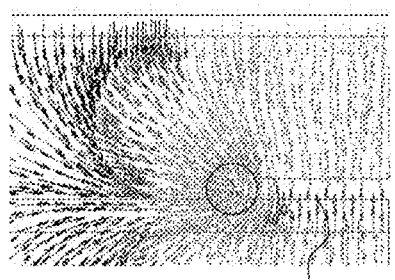
FIG. 9 is a diagram illustrating an electric field distribution at a left end portion of a signal conductor layer 22 of the first model.
Figure 10:
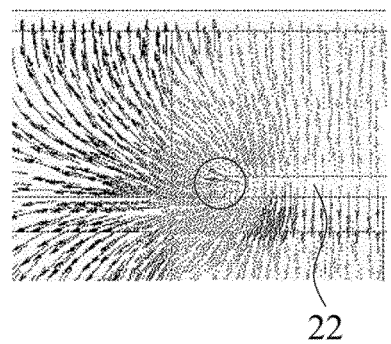
FIG. 10 is a diagram illustrating an electric field distribution at the left end portion of the signal conductor layer 22 of the second model.

FIG. 9 is a diagram illustrating an electric field distribution at the left end portion of the signal conductor layer 22 of the first model. FIG. 10 is a diagram illustrating an electric field distribution at the left end portion of the signal conductor layer 22 of the second model. When FIG. 9 and FIG. 10 are compared with each other, it can be seen that the concentration of the electric field at the corner of the signal conductor layer 22 is more reduced or prevented in the first model than in the second model. As a result, in the first model, concentration of current at the corner of the signal conductor layer 22 is reduced or prevented. As a result, in the first model, the transmission loss of the high-frequency signal is reduced more than in the second model.

Figure 11:
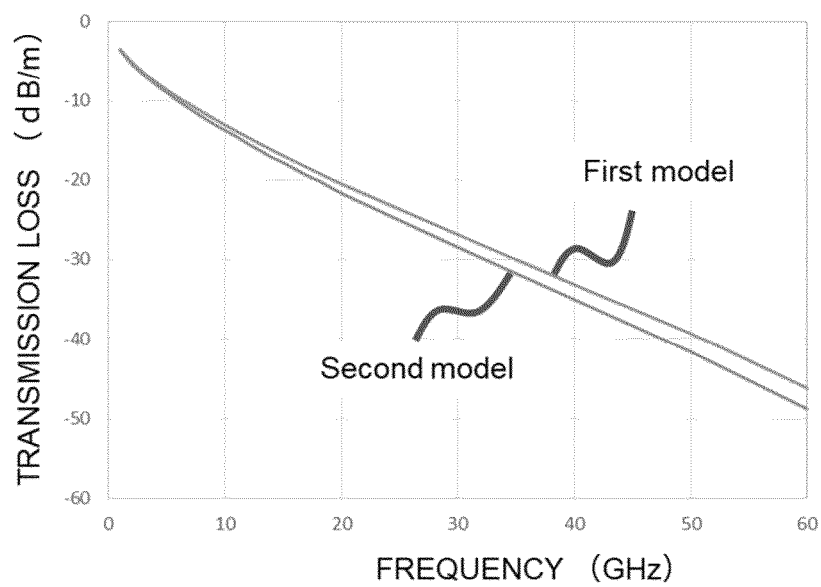
FIG. 11 is a graph illustrating a relationship between the frequency and the transmission loss of the first model and the second model.

FIG. 11 is a graph illustrating a relationship between frequencies of the first model and the second model and transmission losses of the first model and the second model. The horizontal axis represents the frequency of the high-frequency signal transmitted through the signal conductor layer 22. The vertical axis represents the transmission loss of the transmission line per meter of the first model and the second model. According to FIG. 11, it is understood that the transmission loss of the first model (transmission line 10a) is smaller than the transmission loss of the second model (transmission line 500).

Third Modification

Figure 12:
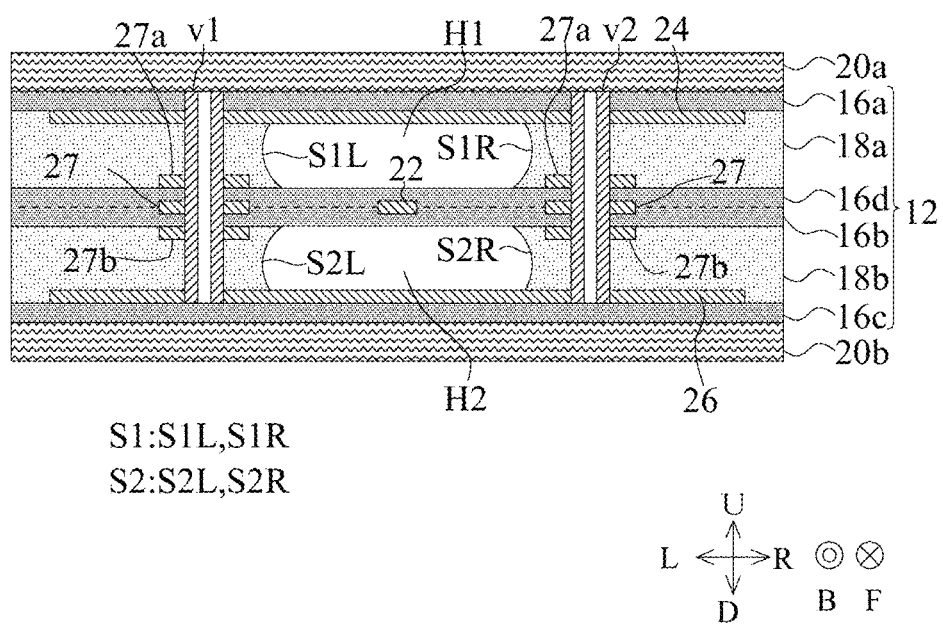
FIG. 12 is a cross-sectional view of a transmission line 10c.

Hereinafter, a transmission line 10c according to a third modification of a preferred embodiment of the present invention will be described with reference to the drawings. FIG. 12 is a cross-sectional view of the transmission line 10c.

The transmission line 10c is different from the transmission line 10a in that the transmission line 10c further includes an insulator layer 16d and third ground conductor layers 27a and 27b. More specifically, the insulator layer 16d is provided between the insulator layer 18a and the insulator layer 16b. Thus, the signal conductor layer 22 is located between the insulator layer 16d and the insulator layer 16b. That is, the signal conductor layer 22 is not located in the first hole H1. As described above, since the signal conductor layer 22 is surrounded by the insulator layers 16b and 16d, a short circuit between the signal conductor layer 22 and another conductor layer is reduced or prevented. Furthermore, deterioration of the signal conductor layer 22 due to oxidation or the like is reduced or prevented.

In addition, the third ground conductor layer 27a is provided on the upper main surface of the insulator layer 16b. The third ground conductor layer 27b is provided on the lower main surface of the insulator layer 16d. Since the other structure of the transmission line 10c is the same as that of the transmission line 10a, description thereof will be omitted. The transmission line 10c can achieve the same effect as the transmission line 10.

In addition, the third ground conductor layer 27a is located above the signal conductor layer 22 in the element body up-down direction, and the third ground conductor layer 27b is located below the signal conductor layer 22 in the element body up-down direction. This improves a shielding property with respect to the signal conductor layer 22.

Fourth Modification

Figure 13:
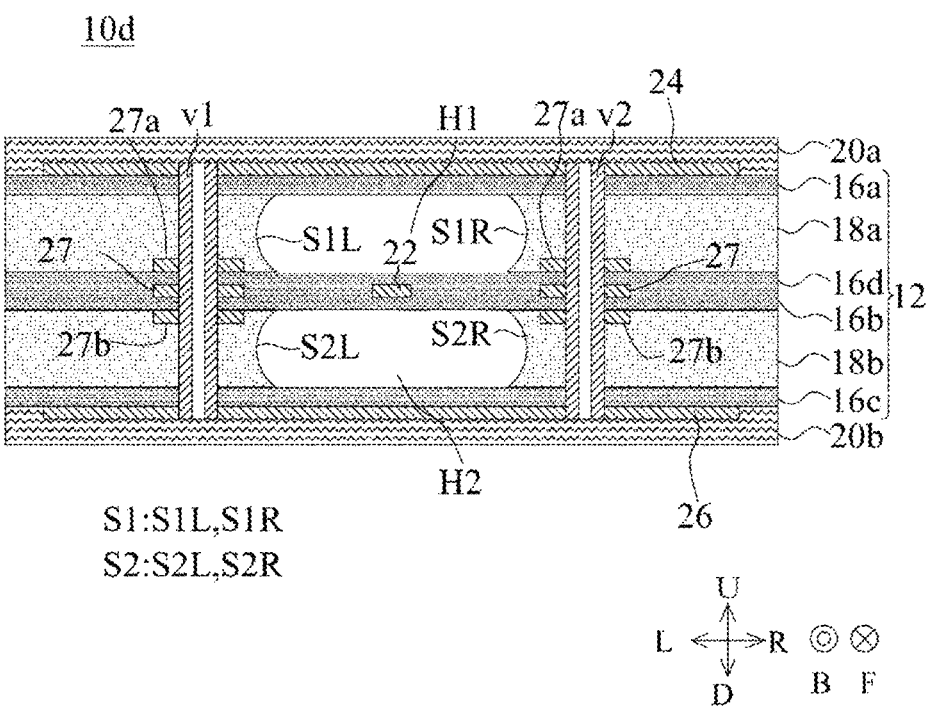
FIG. 13 is a cross-sectional view of a transmission line 10d.

Hereinafter, a transmission line 10d according to a fourth modification of a preferred embodiment of the present invention will be described with reference to the drawings. FIG. 13 is a cross-sectional view of the transmission line 10d.

The transmission line 10d is different from the transmission line 10c in the position where the first ground conductor layer 24 and the second ground conductor layer 26 are provided. More specifically, the first ground conductor layer 24 is provided on the upper main surface of the insulator layer 16a. The second ground conductor layer 26 is provided on the lower main surface of the insulator layer 16c. Since the other structure of the transmission line 10d is the same as that of the transmission line 10c, description thereof will be omitted. In addition, the transmission line 10d can achieve the same effect as the transmission line 10c.

Fifth Modification

Figure 14:
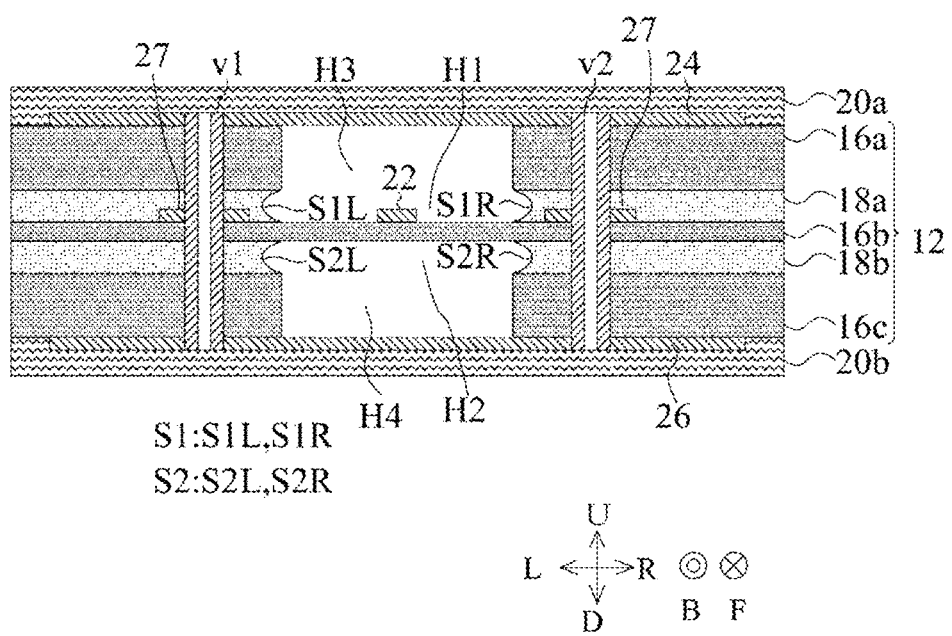
FIG. 14 is a cross-sectional view of a transmission line 10e.

Hereinafter, a transmission line 10e according to a fifth modification of a preferred embodiment of the present invention will be described with reference to the drawings. FIG. 14 is a cross-sectional view of the transmission line 10e.

The transmission line 10e is different from the transmission line 10 in the thicknesses of the insulator layers 16a, 16c, 18a, and 18b and the presence or absence of the holes H3 and H4. More specifically, in the transmission line 10e, the thicknesses of the insulator layers 18a and 18b are smaller than the thicknesses of the insulator layers 16a and 16c. In addition, the holes H3 and H4 are provided in the insulator layers 16a and 16c, respectively. The holes H3 and H4 penetrate the insulator layers 16a and 16c in the element body up-down direction, respectively. Further, the hole H3 is connected to the first hole H1. The hole H4 is connected to the second hole H2. Since the other structure of the transmission line 10e is the same as that of the transmission line 10, the description thereof will be omitted.

The insulator layers 18a and 18b are adhesive layers. Therefore, the thicknesses of the insulator layers 18a and 18b are likely to change when the element body 12 is pressure-bonded. Thus, the thicknesses of the insulator layers 18a and 18b are smaller than the thicknesses of the insulator layers 16a and 16b. The amount of change in the thicknesses of the insulator layers 18a and 18b during pressure-bonding of the element body 12 is reduced. This reduces or prevents the occurrence of variations in the sizes of the first hole H1 and the second hole H2 in the element body up-down direction.

Sixth Modification

Figure 15:
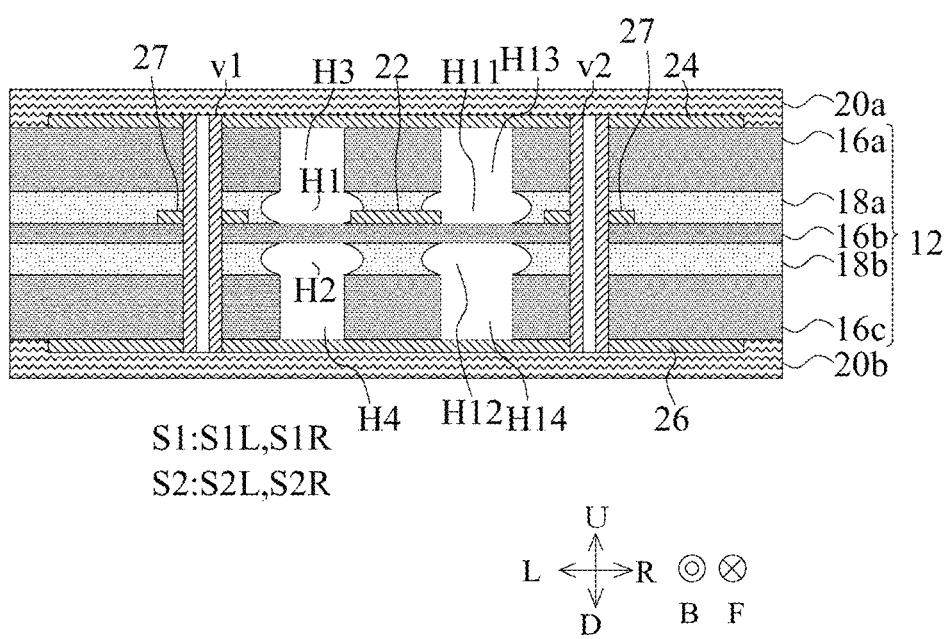
FIG. 15 is a cross-sectional view of a transmission line 10f.

Hereinafter, a transmission line 10f according to a sixth modification of a preferred embodiment of the present invention will be described with reference to the drawings. FIG. 15 is a cross-sectional view of the transmission line 10f.

The transmission line 10f is different from the transmission line 10e in that a first hole H11, a second hole H12, and holes H13 and H14 are provided in the element body 12. More specifically, the first hole H1, the second hole H2, and the holes H3 and H4 are arranged on the left of the center of the element body 12 in the element body left-right direction. In addition, the first hole H11, the second hole H12, and the holes H13 and H14 are arranged on the right side of the center of the element body 12 in the element body left-right direction. Each of the first hole H11, the second hole H12, and the holes H13 and H14 has a bilaterally symmetrical structure with respect to the first hole H1, the second hole H2, and the holes H3 and H4. Since the other structure of the transmission line 10f is the same as that of the transmission line 10e, description thereof will be omitted. In addition, the transmission line 10f can achieve the same effect as the transmission line 10e.

According to the transmission line 10f, a portion of each of the insulator layers 16a to 16c, 18a, and 18b is present between the first hole H1, the second hole H2, and the holes H3 and H4 and the first hole H11, the second hole H12, and the holes H13 and H14. Thus, a portion of each of the insulator layers 16a to 16c, 18a, and 18b functions as a support. As a result, when the transmission line 10f is bent, deformation of each of the first holes H1 and H11, the second holes H2 and H12, and the holes H3, H4, H13, and H14 is reduced or prevented.

Seventh Modification

Hereinafter, a transmission line 10g according to a seventh modification of a preferred embodiment of the present invention will be described with reference to the drawings. FIG. 16 is a cross-sectional view of the transmission line 10g.

The transmission line 10g is different from the transmission line 10f in that a first hole H21, a second hole H22, and holes H23 and H24 are provided in the element body 12. More specifically, the first hole H21, the second hole H22, and the holes H23 and H24 are arranged on the right of the first hole H1, the second hole H2, and the holes H3 and H4 in the element body left-right direction. The first hole H21, the second hole H22, and the holes H23 and H24 are arranged on the left of the first hole H11, the second hole H12, and the holes H13 and H14 in the element body left-right direction. The first hole H21, the second hole H22, and the holes H23 and H24 have the same structure as the first hole H1, the second hole H2, and the holes H3 and H4, respectively. Since the other structure of the transmission line 10g is the same as that of the transmission line 10f, description thereof will be omitted. In addition, the transmission line 10g can achieve the same effect as the transmission line 10f.

According to the transmission line 10g, a portion of each of the insulator layers 16a to 16c, 18a, and 18b is present between the first hole H1, the second hole H2, and the holes H3 and H4 and the first hole H21, the second hole H22, and the holes H23 and H24. A portion of each of the insulator layers 16a to 16c, 18a, and 18b is present between the first hole H11, the second hole H12, and the holes H13 and H14 and the first hole H21, the second hole H22, and the holes H23 and H24. Thus, a portion of each of the insulator layers 16a to 16c, 18a, and 18b functions as a support. As a result, when the transmission line 10g is bent, the deformation of each of the first holes H1, H11, and H21, the second holes H2, H12, and H22, and the holes H3, H4, H13, H14, H23, and H24 is reduced or prevented.

Eighth Modification

Figure 17:
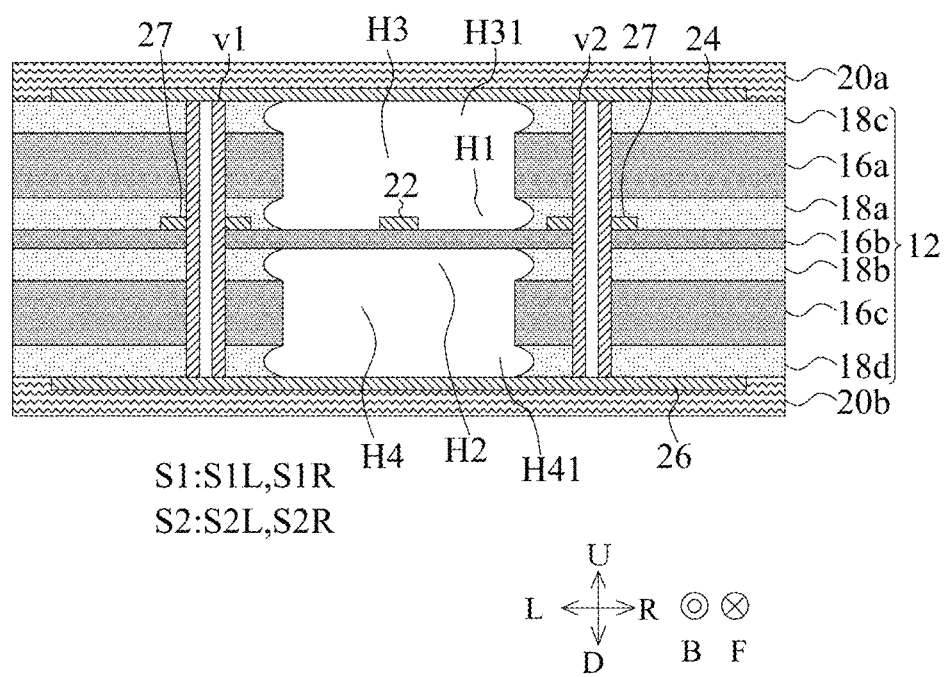
FIG. 17 is a cross-sectional view of a transmission line 10h.

Hereinafter, a transmission line 10h according to an eighth modification of a preferred embodiment of the present invention will be described with reference to the drawings. FIG. 17 is a cross-sectional view of the transmission line 10h.

The transmission line 10h is different from the transmission line 10e in that the transmission line 10h further includes insulator layers 18c and 18d and a first hole H31 and a second hole H41 are provided in the element body 12. The insulator layer 18c is provided above the insulator layer 16a in the element body up-down direction. Therefore, the first ground conductor layer 24 is provided on the upper main surface of the insulator layer 18c. The insulator layer 18d is provided below the insulator layer 16c in the element body up-down direction. Therefore, the second ground conductor layer 26 is provided on the lower main surface of the insulator layer 18d.

The first hole H31 penetrates the insulator layer 18c in the element body up-down direction. The shape of the first hole H31 is the same as that of the first hole H1. The first hole H31 is connected to the hole H3. The second hole H41 penetrates the insulator layer 18d in the element body up-down direction. The shape of the second hole H41 is the same as that of the first hole H1. The second hole H41 is connected to the hole H4. Since the other structure of the transmission line 10h is the same as that of the transmission line 10e, description thereof will be omitted. In addition, the transmission line 10h can achieve the same effect as the transmission line 10e.

The insulator layers 18a to 18d are adhesive layers. Therefore, the thicknesses of the insulator layers 18a to 18d are likely to change when the element body 12 is pressure-bonded. Thus, the thicknesses of the insulator layers 18a to 18d are smaller than the thicknesses of the insulator layers 16a and 16c. The amount of change in the thicknesses of the insulator layers 18a to 18d during pressure-bonding of the element body 12 is reduced. This reduces or prevents the occurrence of variations in the sizes of the first holes H1 and H31, the second holes H2 and H41, and the holes H3 and H4 in the element body up-down direction.

In addition, when a material having a dielectric constant lower than that of the material of the insulator layer 16b or a material having a dielectric loss tangent lower than that of the material of the insulator layer 16b is used as the material of the insulator layers 16a and 16c, the reduction in the transmission loss of the transmission line 10h can be achieved.

Ninth Modification

Figure 18:
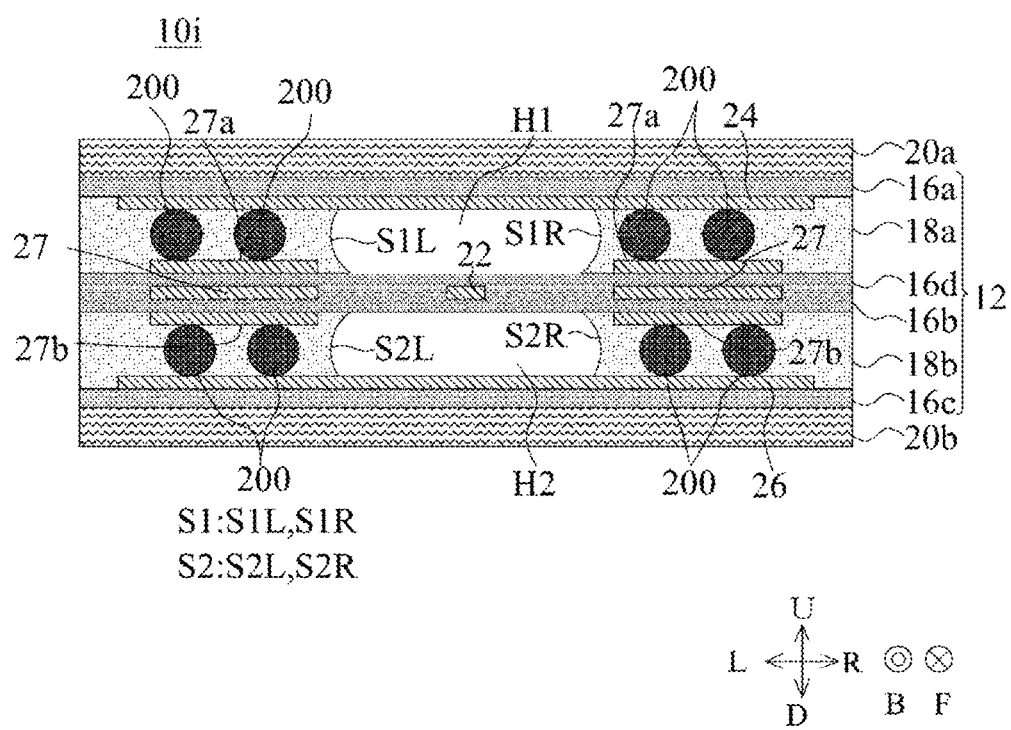
FIG. 18 is a cross-sectional view of a transmission line 10i.

Hereinafter, a transmission line 10i according to a ninth modification of a preferred embodiment of the present invention will be described with reference to the drawings. FIG. 18 is a cross-sectional view of the transmission line 10i.

The transmission line 10i is different from the transmission line 10c in that the transmission line 10i includes a plurality of conductor objects 200 instead of the interlayer connection conductors v1 and v2. More specifically, the plurality of conductor objects 200 is, for example, metallic balls whose surfaces are covered with solder or a conductive adhesive. The diameters of the metallic balls of the plurality of conductor objects 200 are uniform. The plurality of conductor objects 200 is provided in the insulator layer 18a (first insulator layer). The plurality of conductor objects 200 electrically connects the first ground conductor layer 24 and the third ground conductor layer 27a.

The plurality of conductor objects 200 is provided in the insulator layer 18b. The plurality of conductor objects 200 electrically connects the second ground conductor layer 26 and the third ground conductor layer 27b. The plurality of conductor objects 200 is bonded to the second ground conductor layer 26 and the third ground conductor layer 27b. Since the other structure of the transmission line 10i is the same as that of the transmission line 10c, description thereof will be omitted. In addition, the transmission line 10i can achieve the same effect as the transmission line 10c.

According to the transmission line 10i, the interlayer connection conductors v1 and v2 become unnecessary. Therefore, a plating step for forming the interlayer connection conductors v1 and v2 is not required. Therefore, the plating solution does not enter the transmission line 10i.

According to the transmission line 10i, a distance between the insulator layer 16a and the insulator layer 16d is substantially determined by the diameters of the metallic balls of the plurality of conductor objects 200. Similarly, a distance between the insulator layer 16b and the insulator layer 16c is substantially determined by the diameters of the metallic balls of the plurality of conductor objects 200. This reduces or prevents variations in the distance between the insulator layer 16a and the insulator layer 16d and the distance between the insulator layer 16b and the insulator layer 16c. That is, variations in the size of the first hole H1 in the element body up-down direction and the size of the second hole H2 in the element body up-down direction are reduced or prevented.

Tenth Modification

Figure 19:
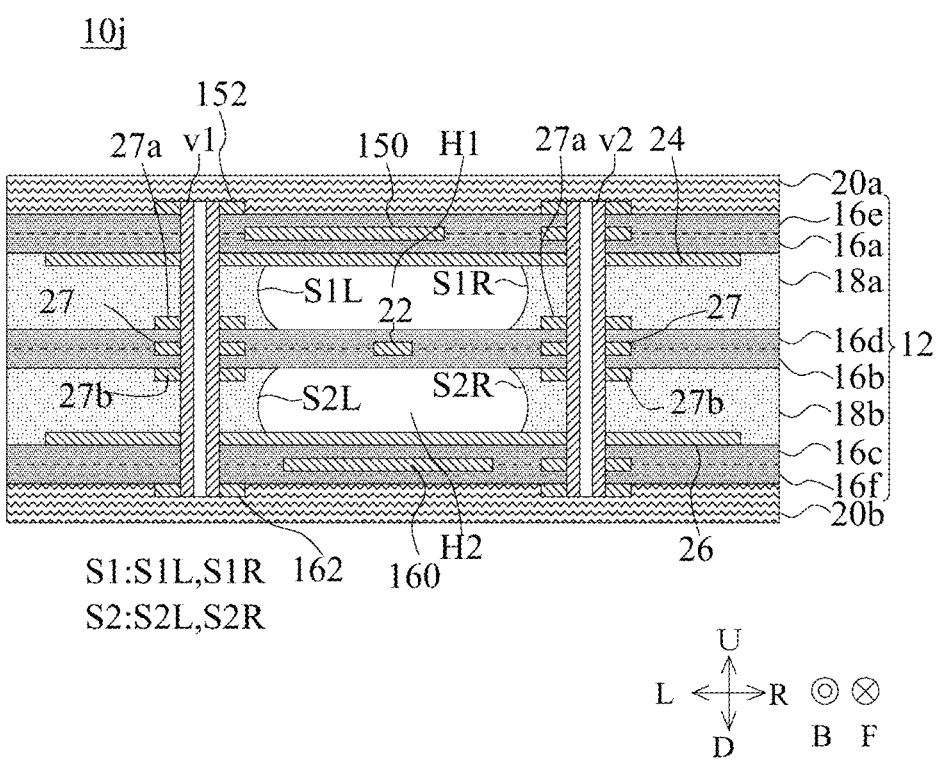
FIG. 19 is a cross-sectional view of a transmission line 10j.

Hereinafter, a transmission line 10j according to a tenth modification of a preferred embodiment of the present invention will be described with reference to the drawings. FIG. 19 is a cross-sectional view of the transmission line 10j.

The transmission line 10j is different from the transmission line 10c in that the transmission line 10j further includes insulator layers 16e and 16f and conductor layers 150, 152, 160, and 162. More specifically, the insulator layer 16e is provided above the insulator layer 16a in the element body up-down direction. The insulator layer 16f is provided below the insulator layer 16c in the element body up-down direction. The conductor layer 150 is provided on the lower main surface of the insulator layer 16e. The conductor layer 152 is provided on the upper main surface of the insulator layer 16e. The conductor layer 160 is provided on the upper main surface of the insulator layer 16f. The conductor layer 162 is provided on the lower main surface of the insulator layer 16f. The conductor layers 150, 152, 160, and 162 are signal wirings or ground conductors. By providing the conductor layers 150, 152, 160, and 162 in this manner, an electric circuit is added to the transmission line 10j. Since the other structure of the transmission line 10j is the same as that of the transmission line 10c, description thereof will be omitted. In addition, the transmission line 10j can achieve the same effect as the transmission line 10c.

Eleventh Modification

Figure 20:
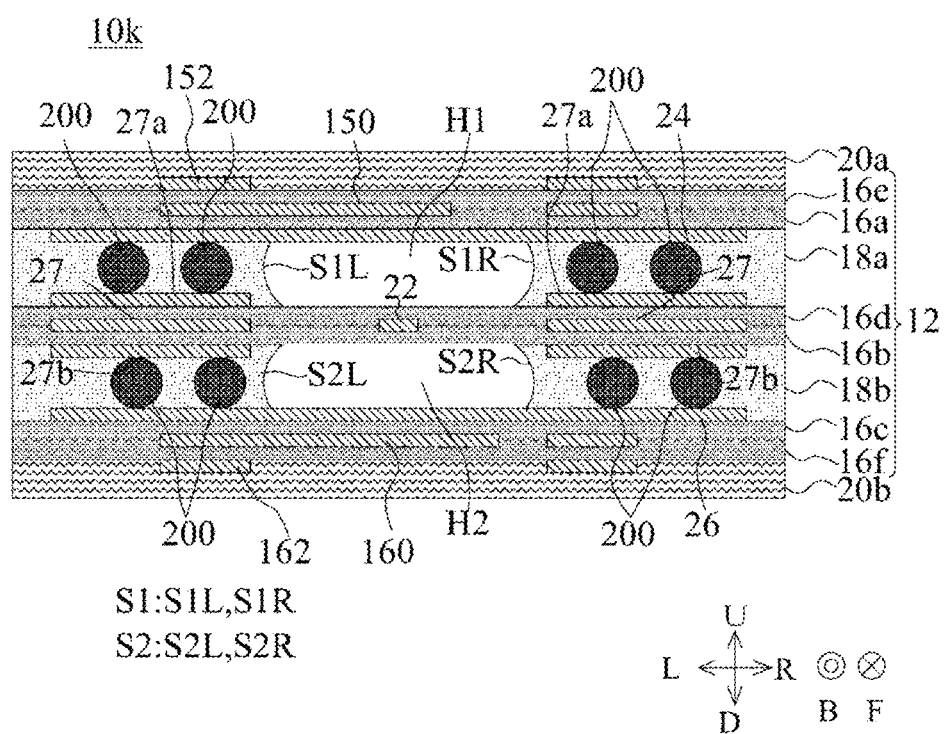
FIG. 20 is a cross-sectional view of a transmission line 10k.

Hereinafter, a transmission line 10k according to an eleventh modification of a preferred embodiment of the present invention will be described with reference to the drawings. FIG. 20 is a cross-sectional view of the transmission line 10k.

The transmission line 10k is different from the transmission line 10j in that the transmission line 10k includes the plurality of conductor objects 200 instead of the interlayer connection conductors v1 and v2. More specifically, the diameters of the plurality of conductor objects 200 are uniform. The plurality of conductor objects 200 is provided in the insulator layer 18a (first insulator layer). The plurality of conductor objects 200 electrically connects the first ground conductor layer 24 and the third ground conductor layer 27a.

The plurality of conductor objects 200 is provided in the insulator layer 18b. The plurality of conductor objects 200 electrically connects the second ground conductor layer 26 and the third ground conductor layer 27b. Since the other structure of the transmission line 10k is the same as that of the transmission line 10j, description thereof will be omitted. In addition, the transmission line 10k can achieve the same effect as the transmission line 10j.

Twelfth Modification

Figure 21:
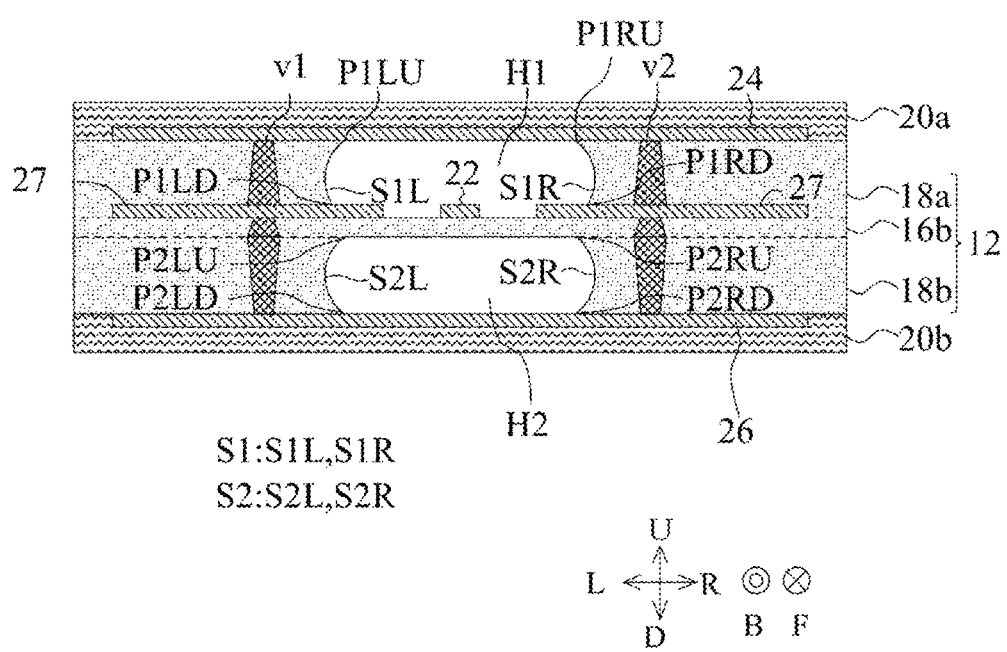
FIG. 21 is a cross-sectional view of a transmission line 10l.

Hereinafter, a transmission line 10l according to a twelfth modification of a preferred embodiment of the present invention will be described with reference to the drawings. FIG. 21 is a cross-sectional view of the transmission line 10l.

The transmission line 10l is different from the transmission line 10 in that the transmission line 10l does not include the insulator layers 16a and 16c, the material of the insulator layer 16b is the same as the material of the insulator layers 18a and 18b, and the interlayer connection conductors v1 and v2 are via-hole conductors. More specifically, the insulator layer 16b (third insulator layer) is provided below the insulator layer 18a (first insulator layer) in the element body up-down direction. The material of the insulator layer 16b (third insulator layer) is the same as the material of the insulator layers 18a and 18b (first insulator layer). The material of the insulator layers 16b, 18a, and 18b is thermoplastic resin such as polyimide, liquid crystal polymer, and PTFE (polytetrafluoroethylene).

The first ground conductor layer 24 is provided on the upper main surface of the insulator layer 18a. The second ground conductor layer 26 is provided on the lower main surface of the insulator layer 18b. The interlayer connection conductors v1 and v2 electrically connect the first ground conductor layer 24 and the second ground conductor layer 26. The interlayer connection conductors v1 and v2 are via-hole conductors. The via-hole conductors are produced by forming through-holes in the insulator layers 16b, 18a, and 18b, filling the through-holes with a conductive paste, and then sintering the conductive paste. Since the other structure of the transmission line 10l is the same as that of the transmission line 10, the description thereof will be omitted. In addition, the transmission line 10l can achieve the same effect as the transmission line 10.

In the transmission line 10l, it is possible to reduce the transmission loss of the transmission line 10l. More specifically, in the transmission line, an adhesive layer may be used to bond a plurality of insulator layers. However, since the adhesive layer is required to have high adhesiveness, it may be difficult to use a material having a low dielectric constant or a low dielectric loss tangent for the adhesive layer. Therefore, in the transmission line 10l, the material of the insulator layers 18a and 18b is thermoplastic resin, which is the same as the material of the insulator layer 16b. Therefore, the insulator layers 18a, 16b, and 18b can be bonded by thermal pressure-bonding. This eliminates the need for the adhesive layer for bonding the insulator layers. As a result, in the transmission line 10l, it is possible to reduce the transmission loss of the transmission line 10l.

In the transmission line 10l, the material of the insulator layer 16b is the same as the material of the insulator layers 18a and 18b. Therefore, the coefficient of linear expansion of the insulator layer 16b is equal to the coefficient of linear expansion of the insulator layers 18a and 18b. When the temperature of the transmission line 10l changes, this reduces or prevents stress generated in the element body 12 due to the difference between the coefficient of linear expansion of the insulator layer 16b and the coefficient of linear expansion of the insulator layers 18a and 18b.

In the transmission line 10l, the interlayer connection conductors v1 and v2, which are via-hole conductors, can be formed when the element body 12 is thermal pressure-bonded.

Thirteenth Modification

Figure 22:
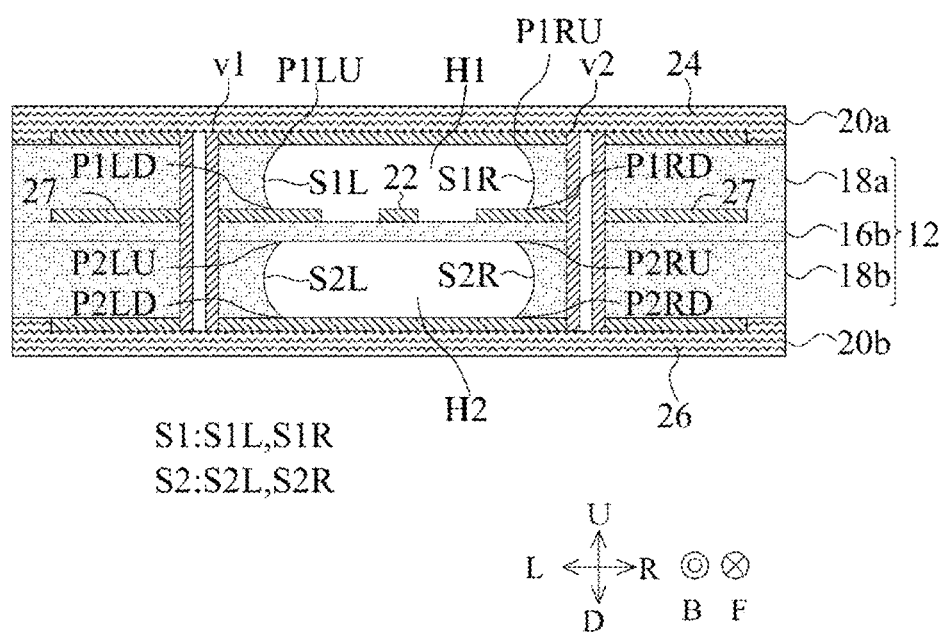
FIG. 22 is a cross-sectional view of a transmission line 10m.

Hereinafter, a transmission line 10m according to a thirteenth modification of a preferred embodiment of the present invention will be described with reference to the drawings. FIG. 22 is a cross-sectional view of the transmission line 10m.

The transmission line 10m is different from the transmission line 10l in that the interlayer connection conductors v1 and v2 are through-hole conductors. Since the other structure of the transmission line 10m is the same as that of the transmission line 10l, description thereof will be omitted. In addition, the transmission line 10m can achieve the same effect as the transmission line 10l.

Fourteenth Modification

Figure 23:
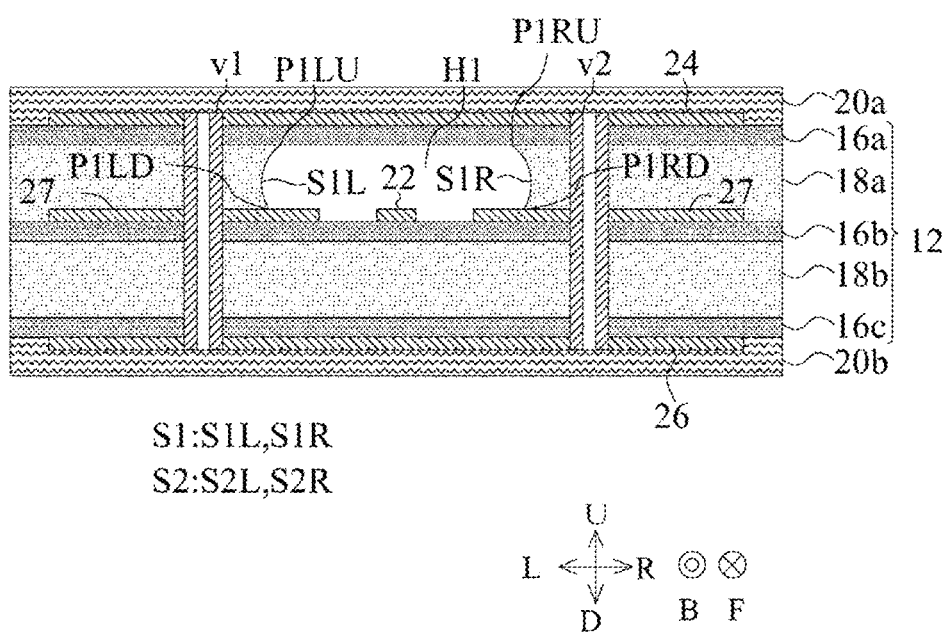
FIG. 23 is a cross-sectional view of a transmission line 10n.

Hereinafter, a transmission line 10n according to a fourteenth modification of a preferred embodiment of the present invention will be described with reference to the drawings. FIG. 23 is a cross-sectional view of the transmission line 10n.

The transmission line 10n is different from the transmission line 10 in that the second hole H2 is not provided. Since the other structure of the transmission line 10n is the same as that of the transmission line 10, the description thereof will be omitted. In addition, the transmission line 10n can achieve the same effect as the transmission line 10. Note that also in the transmission lines 10a to 10m, the second hole H2 is not necessary to be provided.

Fifteenth Modification

Figure 24:
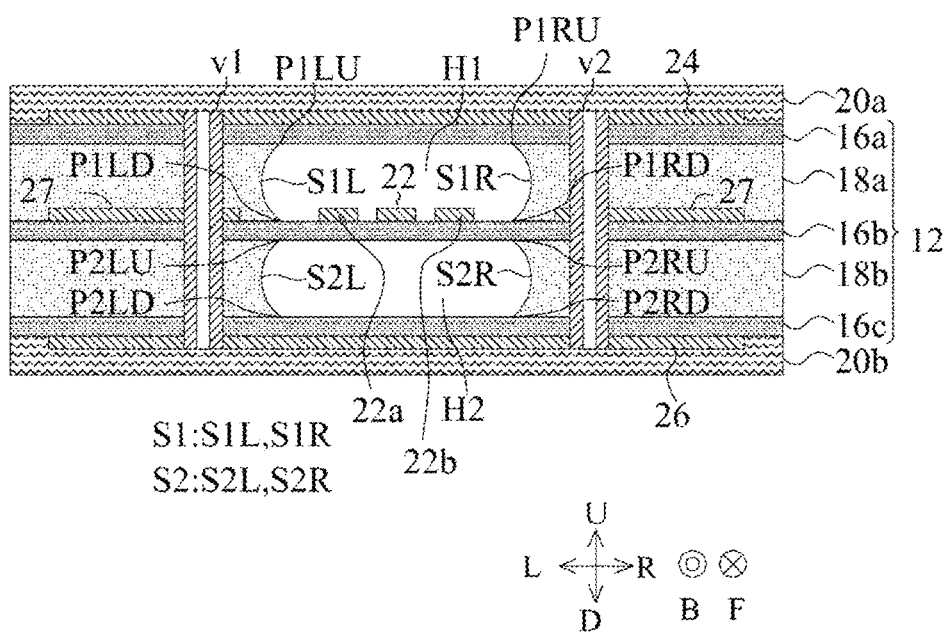
FIG. 24 is a cross-sectional view of a transmission line 10o.

Hereinafter, a transmission line 10o according to a fifteenth modification of a preferred embodiment of the present invention will be described with reference to the drawings. FIG. 24 is a cross-sectional view of the transmission line 10o.

The transmission line 10o is different from the transmission line 10 in that the transmission line 10o further includes signal conductor layers 22a and 22b. The signal conductor layer 22a is provided on the left of the signal conductor layer 22 in the element body left-right direction. The signal conductor layer 22b is provided on the right of the signal conductor layer 22 in the element body left-right direction. Since the other structure of the transmission line 10o is the same as that of the transmission line 10, the description thereof will be omitted. In addition, the transmission line 10o can achieve the same effect as the transmission line 10. Note that the transmission line 10o may include two signal conductor layers or may include four or more signal conductor layers. In addition, two adjacent signal conductor layers among the plurality of signal conductor layers may constitute a differential transmission line. Note that the transmission lines 10a to 10m may further include the signal conductor layers 22a and 22b.

OTHER PREFERRED EMBODIMENTS

Transmission lines according to preferred embodiments of the present invention are not limited to the transmission lines 10 and 10a to 10o, and can be changed within the scope of the gist of the present invention. Note that the configurations of the transmission lines 10 and 10a to 10o may be arbitrarily combined.

Note that in all cross sections of the transmission lines 10 and 10a to 10o, the left portion S1L of the first hole forming surface S1 does not need to include a portion located on the left of the upper end P1LU and the lower end P1LD in the element body left-right direction. Therefore, in a portion of the cross sections of the transmission lines 10 and 10a to 10o, the left portion S1L of the first hole forming surface S1 may include a portion located on the left of the upper end P1LU and the lower end P1LD in the element body left-right direction.

Note that in all the cross sections of the transmission lines 10 and 10a to 10o, the right portion S1R of the first hole forming surface S1 does not need to include a portion located on the right of the upper end P1RU and the lower end P1RD in the element body left-right direction. Therefore, in a portion of the cross sections of the transmission line 10 and 10a to 10o, the right portion S1R of the first hole forming surface S1 may include a portion located on the right of the upper end P1RU and the lower end P1RD in the element body left-right direction.

Note that in the transmission lines 10 and 10a to 10o, the second ground conductor layer 26 is not an essential configuration. In addition, when the transmission line 10 does not include the second ground conductor layer 26, the insulator layers 18b and 16c, and the protective layer 20b, the signal conductor layer 22 and the first ground conductor layer 24 may have a microstrip line structure.

Note that in the transmission lines 10 and 10a to 10o, the right portion S1R of the first hole forming surface S1 is not necessary to have a portion located on the right of the upper end P1RU and the lower end P1RD in the element body left-right direction in the cross section orthogonal to the element body front-back direction. However, in the case where both of the left portion S1L and the right portion S1R are curved, it is possible to effectively reduce the transmission loss of the transmission line 10 while effectively reducing or preventing the separation between the insulator layer 16a and the insulator layer 18a and the separation between the insulator layer 16b and the insulator layer 18a, as compared with the case where either one of the left portion S1L and the right portion S1R is curved. Note that in each of the transmission lines 10i and 10k, the insulator layer 18a may be an anisotropic conductive film. In this case, the plurality of conductor objects 200 is minute metal particles of the anisotropic conductive film.

Note that in the transmission lines 10 and 10a to 10o, the signal terminals 28a and 28b may be provided on the lower main surface of the element body 12.

Note that the transmission lines 10 and 10a to 10o may further include other circuits in addition to the strip line.

Note that electronic components other than the connectors 30a and 30b may be mounted on the transmission lines 10 and 10a to 10o.

Note that the transmission lines 10 and 10a to 10o have a linear shape when viewed in the element body up-down direction. However, the transmission lines 10 and 10a to 10o may be bent. Here, "the transmission lines 10 and 10a to 10o are bent" means that the transmission lines 10 and 10a to 10o have a bent shape in a state where no external force is applied to the transmission lines 10 and 10a to 10o.

Note that in the transmission lines 10 and 10a to 10o, the first hole H1 and the second hole H2 may be provided in the non-bending sections A1 and A3 and are not necessary to be provided in the bending section A2.

Note that in the transmission line 10, the right portion S1R of the first hole forming surface S1 may have a shape that is not bilaterally symmetrical to the left portion S1L of the first hole forming surface S1. For example, when the distance between the signal conductor layer 22 and the lower end P1LD is different from a distance between the signal conductor layer 22 and the lower end of the side P1RD, the right portion S1R of the first hole forming surface S1 has a shape that is not bilaterally symmetrical to the left portion S1L of the first hole forming surface S1. In such a case, one of the left portion S1L and the right portion S1R that is closer to the signal conductor layer 22 may be curved. In addition, one of the left portion S1L and the right portion S1R that is closer to the signal conductor layer 22 may be curved more than the other of the right portion S1R and the left portion S1L that is farther from the signal conductor layer 22. However, when the curves of the left portion S1L and the right portion S1R are too large, the transmission line 10 is easily damaged by impact. Thus, the widths of the left portion S1L in the left-right direction and the right portion S1R in the left-right direction may be smaller than the thicknesses of the transmission line 10 in the up-down direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
an element body including a first insulator layer and a main surface with a normal line extending in an element body up-down direction;
a signal conductor layer below the first insulator layer in the element body in the element body up-down direction; and
a first ground conductor layer above the first insulator layer in the element body in the element body up-down direction; wherein
the first insulator layer includes a first hole penetrating the first insulator layer in the element body up-down direction;
a direction in which the signal conductor layer extends is an element body front-back direction;
a line width direction of the signal conductor layer is an element body left-right direction;
at least a portion of the first hole overlaps the signal conductor layer when viewed in the element body up-down direction;
the first hole extends between a first left hole-defining surface and a first right hole-defining surface; and
in a cross section orthogonal to the element body front-back direction, the first left hole-defining surface includes a first left upper end and a first left lower end in the element body left-right direction, and the first right hole-defining surface includes a first right upper end and a first right lower end in the element body left-right direction.

2. The transmission line according to claim 1, wherein in a cross section orthogonal to the element body front-back direction, the first left hole-defining surface extending between the first left upper end and the first left lower end is curved so as to protrude in an element body left direction.

3. The transmission line according to claim 1, wherein in a cross section orthogonal to the element body front-back direction, the first right hole-defining surface extending between the first right upper end and the first right lower end is curved so as to protrude in an element body right direction.

4. The transmission line according to claim 1, wherein the signal conductor layer is located in the first hole.

5. The transmission line according to claim 1, wherein a front end and a rear end of the signal conductor layer are not located in the first hole.

6. The transmission line according to claim 1, wherein the first hole has a rectangular or substantially rectangular shape.

7. The transmission line according to claim 1, wherein the first ground conductor layer faces the first hole.

8. The transmission line according to claim 1, wherein
the element body further includes a third insulator layer below the first insulator layer in the element body up-down direction; and
a material of the first insulator layer is different from a material of the third insulator layer.

9. The transmission line according to claim 1, wherein
the element body further includes a third insulator layer below the first insulator layer in the element body up-down direction; and
the first insulator layer material and the third insulator layer are made of a same material.

10. The transmission line according to claim 1, wherein
the transmission line further includes a third ground conductor layer below the first insulator layer in the element body up-down direction; and
the first insulator layer includes a conductor that electrically connects the first ground conductor layer and the third ground conductor layer.

11. The transmission line according to claim 1, wherein the transmission line further includes a signal terminal that is electrically connected to the signal conductor layer and provided on an upper main surface or a lower main surface of the element body.

12. An electronic device comprising the transmission line according to claim 1.

13. The transmission line according to claim 1, wherein
the element body further includes a second insulator layer below the first insulator layer in the element body up-down direction;
the signal conductor layer is above the second insulator layer in the element body in the element body up-down direction;
the transmission line further includes a second ground conductor layer provided below the second insulator layer in the element body in the element body up-down direction;
the second insulator layer includes a second hole penetrating the second insulator layer in the element body up-down direction;
at least a portion of the second hole overlaps the signal conductor layer when viewed in the element body up-down direction;
the second hole extends between a second left hole-defining surface and a second right hole-defining surface; and
in a cross section orthogonal to the element body front-back direction, the second left hole-defining surface includes a second left upper end and a second left lower end in the element body left-right direction, and the second right hole-defining surface includes a second right upper end and a second right lower end in the element body left-right direction.

14. The transmission line according to claim 13, wherein in a cross section orthogonal to the element body front-back direction, the second left hole-defining surface extending between the second left upper end and the second left lower end is curved so as to protrude in an element body left direction.

15. The transmission line according to claim 13, wherein in a cross section orthogonal to the element body front-back direction, the second right hole-defining surface extending between the second right upper end and the second right lower end is curved so as to protrude in an element body right direction.

16. The transmission line according to claim 13, wherein the signal conductor layer is located in the second hole.

17. The transmission line according to claim 13, wherein a front end and a rear end of the signal conductor layer are not located in the second hole.

18. The transmission line according to claim 13, wherein the second hole has a rectangular or substantially rectangular shape.

19. An electronic device comprising the transmission line according to claim 13.

* * * * *